(12) United States Patent
Ootake et al.

(10) Patent No.: US 7,880,316 B2
(45) Date of Patent: Feb. 1, 2011

(54) DICING DIE-BONDING FILM AND PROCESS FOR PRODUCING SEMICONDUCTOR DEVICE

(75) Inventors: Hironao Ootake, Ibaraki (JP); Katsuhiko Kamiya, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/625,634

(22) Filed: Nov. 25, 2009

(65) Prior Publication Data

US 2010/0129985 A1 May 27, 2010

(30) Foreign Application Priority Data

Nov. 26, 2008 (JP) ............................. 2008-301555
Jul. 27, 2009 (JP) ............................. 2009-174511

(51) Int. Cl.
*H01L 23/48* (2006.01)
(52) U.S. Cl. ................ 257/783; 257/782; 257/E23.127
(58) Field of Classification Search ................. 257/753, 257/782, 783, E23.127
See application file for complete search history.

(56) References Cited

U.S. PATENT DOCUMENTS

| 4,961,804 | A | | 10/1990 | Aurichio |
| 5,198,064 | A | * | 3/1993 | Tani et al. .................. 156/289 |

FOREIGN PATENT DOCUMENTS

| JP | 60-57642 A | 5/1985 |
| JP | 2-248064 A | 10/1990 |
| JP | 3-268345 A | 11/1991 |
| JP | 2004-186280 A | 7/2004 |
| JP | 2006-128621 A | 5/2006 |

* cited by examiner

*Primary Examiner*—Quoc D Hoang
(74) *Attorney, Agent, or Firm*—Sughrue Mion, PLLC

(57) ABSTRACT

The present invention provides a dicing die-bonding film including: a dicing film having a pressure-sensitive adhesive layer provided on a base material; and a die-bonding film provided on the pressure-sensitive adhesive layer, in which the pressure-sensitive adhesive layer of the dicing film is an active energy ray-curable pressure-sensitive adhesive layer which contains a gas-generating agent in a ratio of 10 to 200 parts by weight based on 100 parts by weight of a base polymer which is a specific acrylic polymer A, and the die-bonding film is formed of a die-adhering layer.

5 Claims, 3 Drawing Sheets

DICING DIE-BONDING FILM AND PROCESS FOR PRODUCING SEMICONDUCTOR DEVICE

FIELD OF THE INVENTION

The present invention relates to a dicing die-bonding film that is used for dicing a workpiece by providing an adhesive for fixing a chip-shaped workpiece (such as a semiconductor chip) and an electrode member onto the workpiece (such as a semiconductor wafer) before dicing.

BACKGROUND OF THE INVENTION

Hitherto, a semiconductor wafer (sometimes simply referred to as "wafer") composed of silicon or gallium arsenide is mounted on a carrier such as a lead frame or a module substrate after a large wafer is cut into a small wafer (die). At the mounting, the wafer is adhered through an adhesive such as an epoxy resin. However, with the progress of miniaturization and thinning of the wafer, it becomes difficult to apply an appropriate amount of the adhesive to the small wafer without damaging the wafer.

With respect to the above-described problem, there is a method of mounting a semiconductor chip after attaching a sheet-shaped die-adhering adhesive layer to a carrier in advance. However, an increase in step number and facility is indispensable since it is necessary to cut the die-adhering adhesive layer into the same size as the size of the semiconductor chip in advance.

Furthermore, various wafer-adhering adhesive tapes simultaneously having a fixing function at wafer cutting and a die-adhering function have been proposed. That is, a semiconductor chip with a die-adhering layer can be obtained by providing a die-adhering layer on a pressure-sensitive adhesive layer of a dicing tape that is a wafer-fixing pressure-sensitive sheet, placing a semiconductor wafer thereon, cutting the wafer into small pieces, and subsequently picking up semiconductor chips through peeling them between the pressure-sensitive adhesive layer and the die-adhering layer.

The above-mentioned method is a production process which enables so-called direct bonding and improves production efficiency of the semiconductor chip to a large extent but there are required such conflicting functions that a wafer should be fixed so as not to cause chip fly in a cutting step and the chip should be easily peeled between the pressure-sensitive adhesive layer and the die-adhering layer so as not to induce picking-up failure in a picking-up step. To deal with the problem, there have been proposed various pressure-sensitive adhesive tapes having a mechanism of changing a pressure-sensitive adhesive force between the wafer-fixing pressure-sensitive adhesive layer and the die-adhering layer by imparting an external stimulus such as heat or a radiation ray (see e.g., Patent Documents 1 to 4).

For example, Patent Document 1 (JP-A-2-248064) discloses a film wherein a dicing tape having a pressure-sensitive adhesive layer where a radiation ray-curable additive is added to a usual pressure-sensitive adhesive is laminated with a die-adhering layer in an integrated fashion. After diced, the wafer is irradiated with a radiation ray to cure the pressure-sensitive adhesive of the dicing tape and lower the pressure-sensitive adhesiveness and then a semiconductor chip is peeled off at the interface between the die-adhering layer and the dicing tape in a perpendicular direction to pick up the wafer with the die-adhering layer. However, in the method of using radiation ray irradiation, it is difficult to balance the holding force at dicing and the peeling ability at picking-up. For example, in the case of a large semiconductor chip having a size of 10 mm square or more or an extremely thin chip having a thickness of 25 to 50 μm, it is impossible to pick up the semiconductor chip by a common die bonder.

Moreover, Patent Document 2 (JP-A-3-268345) discloses a method of laminating a die-adhering layer on a pressure-sensitive adhesive layer containing thermally-expandable fine particles but there is a case where fouling occurs on the peeled surface of the die-adhering layer through cohesive failure of the pressure-sensitive adhesive component. The fouling of the die-adhering layer may cause insufficient adhesion to the lead frame, module substrate, and the like or generation of voids at the interface between the die-adhering layer and the lead frame, module substrate, and the like during a reflow step after the semiconductor chip is mounted.

Furthermore, Patent Document 3 (JP-A-2004-186280) proposes a method wherein a gas-generating agent, which generates a gas by an external stimulus such as heat or an ultraviolet light, is dispersed into the pressure-sensitive adhesive layer of a pressure-sensitive adhesive sheet. According to this method, the gas generated by the external stimulus invades into the interface between the pressure-sensitive adhesive layer of the pressure-sensitive adhesive sheet and the die-adhering layer and presses the layers to peel off a part of the interface between the pressure-sensitive adhesive sheet and the die-adhering layer, whereby it becomes possible to peel the pressure-sensitive adhesive layer from the die-adhering layer easily.

Patent Document 4 (JP-A-2006-128621) proposes a method of controlling elastic modulus of the die-adhering layer and peeling strength between the die-adhering layer and the pressure-sensitive adhesive layer of the pressure-sensitive adhesive sheet for easily peeling the pressure-sensitive adhesive layer from the die-adhering layer. However, depending on the composition of the base polymer in the pressure-sensitive adhesive of the pressure-sensitive adhesive sheet, there is a case where the pressure-sensitive adhesive layer of the pressure-sensitive adhesive sheet is strongly adhered to the die-adhering layer and the picking-up is not satisfactorily performed.

SUMMARY OF THE INVENTION

The invention has been made in view of the above problems, and an object thereof is to provide a dicing die-bonding film composed of a dicing film having a pressure-sensitive adhesive layer containing a gas-generating agent and a die-bonding film formed of a die-adhering layer, wherein the pressure-sensitive adhesive layer can be easily peeled from the die-adhering layer even when a semiconductor wafer to be attached to the die-adhering layer is thin or large one, the pressure-sensitive adhesive layer and the die-adhering layer do not re-adhere after once peeled, and a good picking-up is realized.

The inventors of the present application have investigated a dicing die-bonding film in order to solve the above conventional problems. As a result, it has been found that, when there is used a dicing die-bonding film comprising a dicing film whose pressure-sensitive adhesive layer is an active energy ray-curable pressure-sensitive adhesive layer containing a gas-generating agent in a prescribed ratio and containing an acrylic polymer derived from a specific monomer composition and a die-bonding film formed of a die-adhering layer, the pressure-sensitive adhesive layer can be easily peeled from the die-adhering layer even when a semiconductor wafer to be attached to the die-adhering layer is thin or large one as well as the pressure-sensitive adhesive layer and the die-adhering layer do not re-adhere after once peeled and thus a good picking-up can be realized. Thus, the inventors have accomplished the invention.

Namely, the present invention relates to a dicing die-bonding film comprising:

a dicing film having a pressure-sensitive adhesive layer provided on a base material; and a die-bonding film provided on the pressure-sensitive adhesive layer, wherein the pressure-sensitive adhesive layer of the dicing film is an active energy ray-curable pressure-sensitive adhesive layer which contains a gas-generating agent in a ratio of 10 to 200 parts by weight based on 100 parts by weight of a base polymer, wherein the base polymer is an acrylic polymer A having a constitution that a polymer composed of a monomer composition containing 50% by weight or more of an acrylic acid ester represented by $CH_2$=CHCOOR (wherein R is an alkyl group having 6 to 10 carbon atoms) and 10% by weight to 30% by weight of a hydroxyl group-containing monomer and containing no carboxyl group-containing monomer is addition reacted with an isocyanate compound having a radical-reactive carbon-carbon double bond in an amount of 50 mol % to 95 mol % based on the hydroxyl group-containing monomer, and wherein the die-bonding film is formed of a die-adhering layer.

As above, in the dicing die-bonding film of the invention, the pressure-sensitive adhesive layer of the dicing film is an active energy ray-curable pressure-sensitive adhesive layer which contains a gas-generating agent in a ratio of 10 parts by weight to 200 parts by weight based on 100 parts by weight of a base polymer and the base polymer is the acrylic polymer A. Therefore, the pressure-sensitive adhesive layer (dicing film) can be easily peeled from the die-adhering layer (die-bonding film) even when a semiconductor wafer to be pasted to the die-adhering layer is thin or large one. Additionally, the pressure-sensitive adhesive layer and the die-adhering layer do not re-adhere after once peeled and thus a good picking-up can be realized. Of course, the active energy ray-curable pressure-sensitive adhesive layer that is a pressure-sensitive adhesive layer of the dicing film has pressure-sensitive adhesiveness (holding power) and thus can well hold the thin workpiece (semiconductor wafer) at the dicing. In addition, since the die-bonding film is attached to the semiconductor wafer after peeling of the active energy ray-curable pressure-sensitive adhesive layer from the die-adhering layer, a semiconductor chip can be adhered and fixed to a prescribed adhered using the die-bonding film in the next step to produce a semiconductor device by effectively performing appropriate treatment(s) and the like after the next step.

In this connection, in the acrylic polymer A as the base polymer of the active energy ray-curable pressure-sensitive adhesive layer, by using an alkyl acrylate represented by $CH_2$=CHCOOR (wherein R is an alkyl group having 6 to 10 carbon atoms) as an acrylic acid ester in the monomer composition in an amount of 50% by weight or more based on the total amount of the monomer composition, pressure-sensitive adhesive force between the active energy ray-curable pressure-sensitive adhesive layer and the die-adhering layer can be reduced and the pick-up properties can be improved. Moreover, by using 10% by weight to 30% by weight of the hydroxyl group-containing monomer based on the total amount of the monomer composition, the base polymer can form a crosslinked structure, the pressure-sensitive adhesive force between the active energy ray-curable pressure-sensitive adhesive layer and the die-adhering layer can be appropriately regulated, and also adhesive residue of the pressure-sensitive adhesive components on the die-adhering layer can be prevented at the time when the active energy ray-curable pressure-sensitive adhesive layer is peeled from the die-adhering layer. Furthermore, since the monomer composition of the base polymer contains no carboxyl group-containing monomer, a possibility that the pressure-sensitive adhesive layer is strongly adhered to the die-adhering layer to be impossible to peel can be prevented. Moreover, by using an isocyanate compound having a radical-reactive carbon-carbon double bond in a range of 50 mol % to 95 mol % based on the hydroxyl group-containing monomer, the active energy ray-curable pressure-sensitive adhesive layer can be suitably cured by ultraviolet ray irradiation and thus the pick-up properties can be improved.

In the invention, as the gas-generating agent, a light irradiation-type gas-generating agent that generates a gas by light can be suitably used.

Moreover, it is preferable that the active energy ray-curable pressure-sensitive adhesive layer of the above dicing film has a gel fraction after curing by active energy ray irradiation of 90% by weight or more. As above, when the gel fraction of the active energy ray-curable pressure-sensitive adhesive layer after active energy ray irradiation curing is 90% by weight or more, it is possible to prevent the die-adhering layer from fouling with the pressure-sensitive adhesive composition left on the die-adhering layer through cohesive failure of the active energy ray-curable pressure-sensitive adhesive layer at the time when the active energy ray-curable pressure-sensitive adhesive layer is peeled from the die-adhering layer. Moreover, the re-adhesion of the active energy ray-curable pressure-sensitive adhesive layer to the die-adhering layer once peeled off can also be prevented.

In the dicing die-bonding film of the invention, the active energy ray-curable pressure-sensitive adhesive layer of the dicing film preferably has an elastic modulus (temperature: 23° C., drawing rate: 50 mm/min, distance between chucks: 10 mm) after curing by active energy ray irradiation of 10 MPa or more. When the elastic modulus of the active energy ray-curable pressure-sensitive adhesive layer of the dicing film (particularly elastic modulus of the acrylic polymer A) falls within the above range, the re-adhesion of the active energy ray-curable pressure-sensitive adhesive layer to the die-adhering layer can be further more effectively prevented at the time when the dicing film is peeled from the die-bonding film.

Moreover, the invention provides a process for producing a semiconductor device which comprises using the above-described dicing die-bonding film.

According to the dicing die-bonding film of the invention, the pressure-sensitive adhesive layer can be easily peeled from the die-adhering layer even when a semiconductor wafer to be attached to the die-adhering layer is thin or large one as well as the pressure-sensitive adhesive layer and the die-adhering layer do not re-adhere after once peeled and thus a good picking-up can be realized. Additionally, after peeling, since a die-bonding film is attached to the resulting semiconductor chip, the semiconductor chip can be adhered and fixed utilizing the die-bonding film in the next step.

The dicing die-bonding film of the invention can be used at the time when a workpiece is diced, in such a state that an adhesive for fixing a chip-shaped workpiece such as a semiconductor chip to an electrode member is provided beforehand onto a workpiece such as a semiconductor wafer before dicing. By the use of the dicing die-bonding film of the invention, it becomes possible to easily produce a semiconductor device in which a semiconductor chip is fixed to an electrode member.

Figure 1:
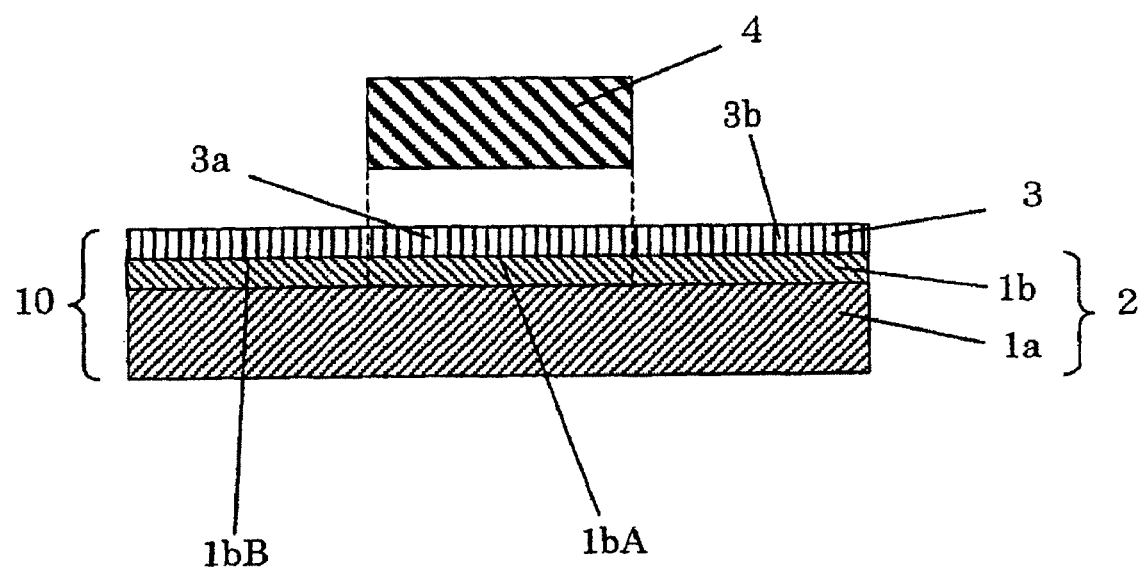
FIG. 1 is a cross-sectional schematic view showing a dicing die-bonding film according to one embodiment of the invention.

DESCRIPTION OF REFERENCE NUMERALS AND SIGNS 10, 11 dicing die-bonding film
1a base material
1b active energy ray-curable pressure-sensitive adhesive layer
2 dicing film
3, 31 die-adhering layer (die-bonding film)
4 semiconductor wafer
5 semiconductor chip
6 adhered
7 bonding wire
8 sealing resin
9 spacer

DETAILED DESCRIPTION OF THE INVENTION

Figure 2:
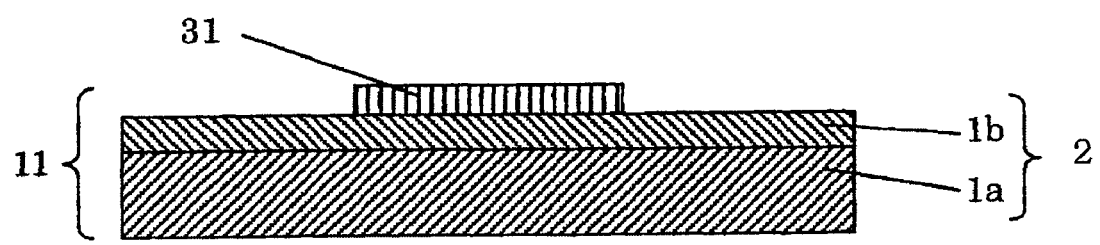
FIG. 2 is a cross-sectional schematic view showing a dicing die-bonding film according to another embodiment of the invention.
Figure 3A:
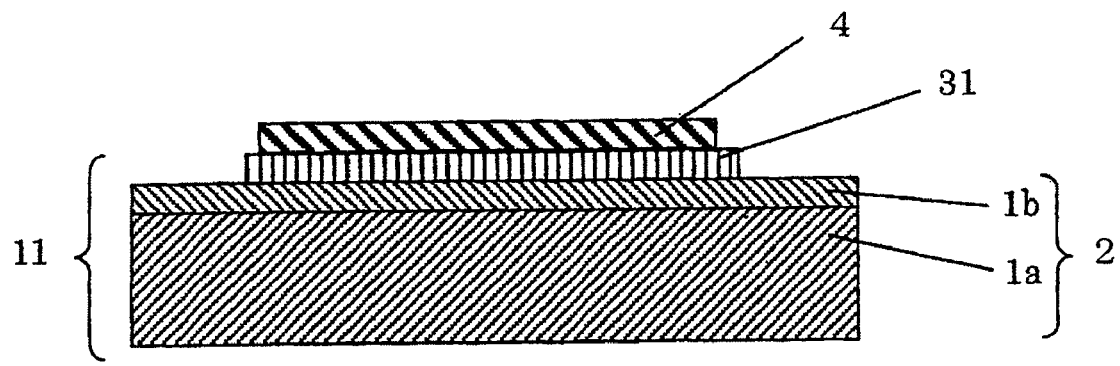
FIGS. 3A to 3E are cross-sectional schematic views showing an example in which a semiconductor chip is mounted on a dicing die-bonding film through a die-bonding film.
Figure 3B:
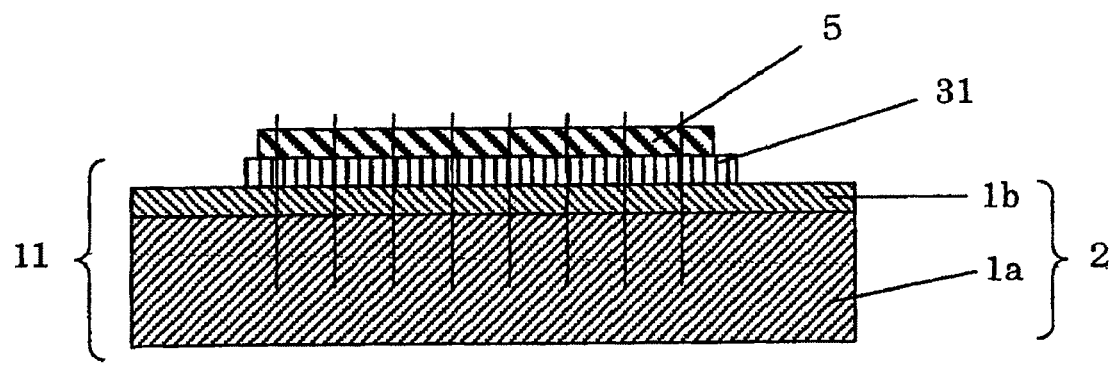
Figure 3C:
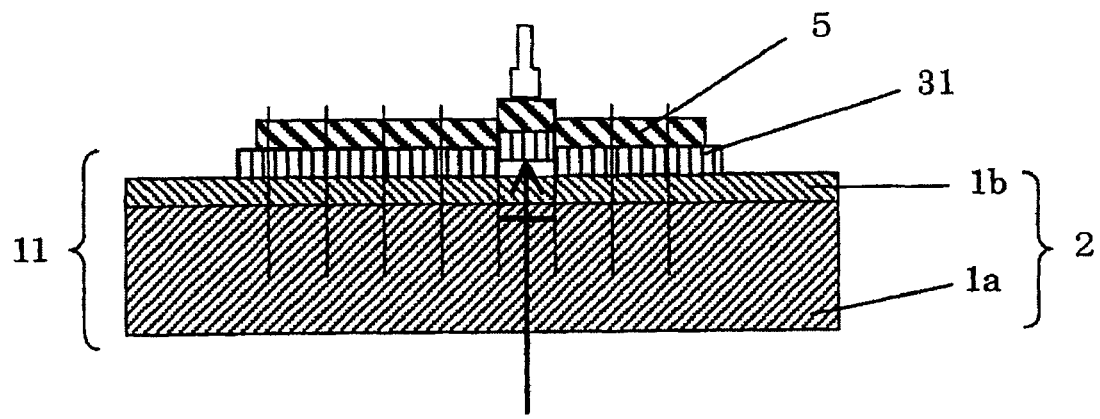
Figure 3D:
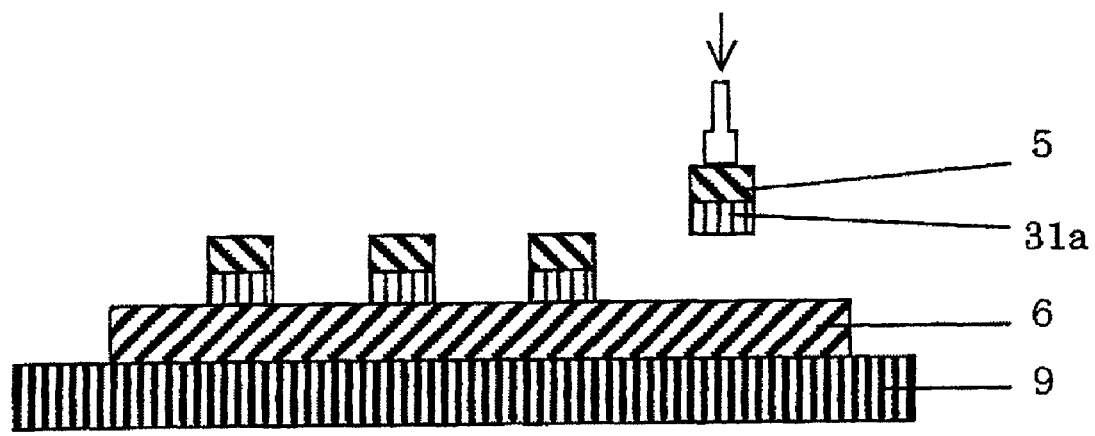
Figure 3E:
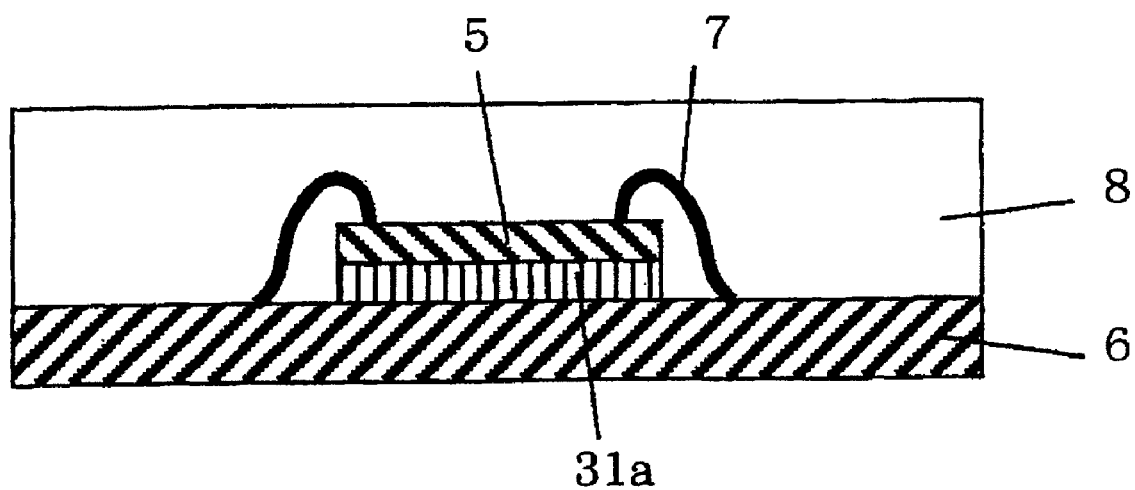

Embodiments of the present invention are described with reference to FIGS. 1 and 2 but the invention is not limited to these embodiments. FIG. 1 is a cross-sectional schematic view showing one embodiment of the dicing die-bonding film of the invention. FIG. 2 is a cross-sectional schematic view showing another embodiment of the dicing die-bonding film of the invention. However, parts that are unnecessary for the description are not given, and there are parts shown by magnifying, minifying, etc. in order to make the description easy.

As shown in FIG. 1, the dicing die-bonding film of the invention is a dicing die-bonding film 10 having a constitution containing a dicing film 2 in which an active energy ray-curable pressure-sensitive adhesive layer 1b containing a gas-generating agent is provided on a base material 1a and a die-adhering layer 3 as a die-bonding film provided on the active energy ray-curable pressure-sensitive adhesive layer 1b. Further, the dicing die-bonding film of the invention may be a dicing die-bonding film 11 having a constitution that a die-adhering layer 31 as a die-bonding film is formed not over the whole surface of the active energy ray-curable pressure-sensitive adhesive layer 1b but only on a semiconductor wafer attaching part as shown in FIG. 2.

(Dicing Film)

The dicing die-bonding film of the invention comprises a dicing film having a pressure-sensitive adhesive layer provided on a base material and a die-bonding film provided on the pressure-sensitive adhesive layer, wherein the dicing film has a constitution that an active energy ray-curable pressure-sensitive adhesive layer containing a gas-generating agent is provided on at least one surface of the base material.

(Active Energy Ray-Curable Pressure-Sensitive Adhesive Layer)

The active energy ray-curable pressure-sensitive adhesive layer is a pressure-sensitive adhesive layer which contains a gas-generating agent in a ratio of 10 to 200 parts by weight based on 100 parts by weight of a base polymer, in which the base polymer is the following acrylic polymer A.

Acrylic polymer A: an acrylic polymer having a constitution that a polymer composed of a monomer composition containing 50% by weight or more of an acrylic acid ester represented by $CH_2=CHCOOR$ (wherein R is an alkyl group having 6 to 10 carbon atoms) and 10% by weight to 30% by weight of a hydroxyl group-containing monomer and containing no carboxyl group-containing monomer is addition reacted with an isocyanate compound having a radical-reactive carbon-carbon double bond in an amount of 50 mol % to 95 mol % based on the hydroxyl group-containing monomer.

(Gas-Generating Agent)

The gas-generating agent is not particularly limited so long as it is a gas-generating agent capable of generating a gas component through decomposition, reaction, or the like induced by a gas-generating means and can be suitably selected from known gas-generating agents. The gas-generating means is not particularly limited and examples thereof include external stimuli. Specifically, examples of the gas-generating means include light, heat and ultrasonic wave, in which light and heat are preferable, and light is particularly preferable. As the light as the gas-generating means, in addition to infrared rays, visible rays, ultraviolet rays, and X-rays, ionizing radiations such as γ-ray, α-ray, β-ray, neutron beam, and electron beam can be utilized. As the light, an active energy ray is preferable and particularly, an ultraviolet ray can be suitably used. Therefore, in the invention, the gas-generating agent is preferably a light irradiation-type gas-generating agent capable of generating a gas by light and further preferably an active energy ray irradiation-type gas-generating agent capable of generating a gas by an active energy ray, and particularly, an ultraviolet ray irradiation-type gas-generating agent capable of generation a gas by an ultraviolet ray can be suitably used.

In the case of using light as the gas-generating means, it is important that the active energy ray-curable pressure-sensitive adhesive layer containing the gas-generating agent is one through which light can transmit or pass. Moreover, in the case where the gas-generating means is heat, it is preferable to use a gas-generating agent capable of generating a gas by heating at a temperature equal to or lower than the glass transition temperature of the thermoplastic resin or the like which constitutes the die-adhering layer. When heating is performed at a temperature higher than the glass transition temperature of the thermoplastic resin or the like which constitutes the die-adhering layer, there is a case where the active energy ray-curable pressure-sensitive adhesive layer cannot be satisfactorily peeled from the die-adhering layer.

Specifically, examples of the gas-generating agent include azo-based gas-generating agents (azo compounds) and azide-based gas-generating agents (azide compounds), and the azo-based gas-generating agent can be preferably used. The gas-generating agents can be used alone or in combination of two or more thereof.

The azo-based gas-generating agent is extremely easily handled since it does not generate a gas by shock. Moreover, since it does not explosively generate a gas as a result of chain reactions, it does not damage an adhered. Furthermore, in the case of a gas-generating agent capable of generating a gas by an ultraviolet ray, there is an advantage that it is possible to control the adhesiveness according to use applications since the generation of the gas can be intermitted when the irradiation with the ultraviolet ray is discontinued. On the other hand, since the azide-based gas-generating agent is easily decomposed by shock to generate a nitrogen gas, there is a problem that it is difficult to handle. Furthermore, since the azide-based gas-generating agent induces chain reactions to generate a nitrogen gas explosively when the decomposition once begins and thus the control is impossible, there is also a problem that the adhered may be damaged by the nitrogen gas generated explosively in some cases. From the problem, in the case where the azide-based gas-generating agent is used as a gas-generating agent, its amount to be used is limited but a sufficient effect is sometimes not obtained by the use of the limited amount.

Examples of the azo-based gas-generating agent (azo compound) include azoamide-based compounds, cyclic azoamidine-based compounds, azoamidine-based compounds, azonitrile-based compounds, and alkylazo-based compounds.

Examples of the azoamide-based compounds include 2,2'-azobis(N-cyclohexyl-2-methylpropionamide), 2,2'-azobis[N-(2-methylpropyl)-2-methylpropionamide], 2,2'-azobis(N-butyl-2-methylpropionamide), 2,2'-azobis[N-(2-methylethyl)-2-methylpropionamide], 2,2'-azobis(N-hexyl-2-methylpropionamide), 2,2'-azobis(N-propyl-2-methylpropionamide), 2,2'-azobis(N-ethyl-2-methylpropionamide), 2,2'-azobis{2-methyl-N-[1,1-bis(hydroxymethyl)-2-hydroxyethyl]propionamide}, 2,2'-azobis{2-methyl-N-[2-(1-hydroxybutyl)]propionamide}, 2,2'-azobis[2-methyl-N-(2-hydroxyethyl)propionamide], 2,2'-azobis[N-(2-propenyl)-2-methylpropionamide], 2,2'-azobis{2-methyl-N[1,1-bis(hydroxymethyl)ethyl]propionamide}, 2,2'-azobis[2-methyl-N-(2-hydroxymethyl)propionamide], 2,2'-azobis(2-methylpropionamide) dihydrate, and azodicarboxylic amide.

Examples of the cyclic azoamidine-based compounds include 2,2'-azobis[2-(5-methyl-2-imidazolin-2-yl)propane]dihydrochloride, 2,2'-azobis[2-(2-imidazolin-2-yl)propane]dihydrochloride, 2,2'-azobis[2-(2-imidazolin-2-yl)propane]disulfate dihydrate, 2,2'-azobis[2-(3,4,5,6-tetrahydropyrimidin-2-yl)propane]dihydrochloride, 2,2'-azobis{2-[1-(2-hydroxyethyl)-2-imidazolin-2-yl]propane}dihydrochloride, 2,2'-azobis[2-(2-imidazolin-2-yl)propane], 2,2'-azobis[2-(4,5,6,7-tetrahydro-1H-1,3-diadipin-2-yl)propane]dihydrochloride, and 2,2'-azobis[2-(5-hydroxy-3,4,5,6-tetrahydropyrimidin-2-yl)propane]dihydrochloride.

Examples of the azoamidine-based compounds include 2,2'-azobis(2-methylpropionamidine) hydrochloride, 2,2'-azobis(2-aminopropane) dihydrochloride, 2,2'-azobis[N-(2-carboxyacyl)-2-methyl-propionamidine], 2,2'-azobis{2-[N-(2-carboxyethyl)amidine]propane}, 2,2'-azobis(2-methyl-N-phenylpropionamidine) dihydrochloride, 2,2'-azobis[N-(4-chlorophenyl)-2-methylpropionamidine]dihydrochloride, 2,2'-azobis[N-(4-hydroxyphenyl)-2-methylpropionamidine] dihydrochloride, 2,2'-azobis[N-(4-aminophenyl)-2-methylpropionamidine]tetrahydrochloride, 2,2'-azobis[2-methyl-N-(phenylmethyl)-propionamidine]dihydrochloride, 2,2'-azobis[2-methyl-N-2-propenylpropionamidine]dihydrochloride, 2,2'-azobis[N-(2-hydroxyethyl)-2-methyl-propionamidine]dihydrochloride, 2,2'-azobis[2-(N-phenylamidino)propane]dihydrochloride, 2,2'-azobis{2-[N-(4-chlorophenyl)amidino]propane}dihydrochloride, 2,2'-azobis{2-[N-(4-aminophenyl)amidino]propane}tetrahydrochloride, 2,2'-azobis[2-(N-allylamidino)propane]dihydrochloride, and 2,2'-azobis{2-[N-(2-hydroxyethyl)amidino]propane}dihydrochloride.

Examples of the azonitrile-based compounds include 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis(2-methylpropionitrile), 2,2'-azobis(2-methylbutyronitrile), 1,1-azobis(cyclohexane-1-carbonitrile), 1-[(1-cyano-1-methylethyl)azo]formamide(2-(carbamoylazo)isobutyronitrile), 2-phenylazo-4-methoxy-2,4-dimethylvaleronitrile, azobisisobutyronitrile, and azocyclohexylnitrile.

Examples of the alkyl azo-based compounds and other azo compounds include 2,2'-azobis(2-methylpropionamide oxime), dimethyl 2,2'-azobis(2-methylpropionate), dimethyl 2,2'-azobisisobutyrate, 4,4'-azobis(4-cyancarbonic acid), 4,4'-azobis(4-cyanopentanoic acid), 2,2'-azobis(2,4,4-trimethylpentane), 2,2'-azobis(2-methylpropane), 4,4'-azobis(4-cyanovaleric acid), 2,2'-azobis[hydroxymethyl]propionate], 2,2'-azobis(2-methylbutanamide oxime) dihydrochloride tetrahydrate, 1,1'-azobis(1-acetoxy-1-phenylethane), 1,1'-azobis(cyclohexane-1-methylcarboxylate), azodiaminobenzene, barium azodicarboxylate, and dimethyl 1,1'-azobis(1-cyclohexanecarboxylate).

Moreover, as the azo-based gas-generating agent, for example, diazo-based compounds (acid anion salts) such as 4-(N-(2-(2,4-di-tert-amylphenoxy)butyryl)piperazino)benzenediazonium, 4-dioctylaminobenzenediazonium, 4-(N-(2-ethylhexanoyl)piperazino)benzenediazonium, 4-dihexylamino-2-hexyloxybenzenediazonium, 4-N-ethyl-N-hexadecylamino-2-ethoxybenzenediazonium, 3-chloro-4-dioctylamino-2-octyloxybenzenediazonium, 2,5-dibutoxy-4-morpholinobenzenediazonium, 2,5-octoxy-4-morpholinobenzenediazonium, 2,5-dibutoxy-4-(N-(2-ethylhexanoyl)piperazino)benzenediazonium, 2,5-diethoxy-4-(N-(2-(2,4-di-tert-amylphenoxy)butyryl)piperazino)benzenediazonium, 2,5-dibutoxy-4-tolylthiobenzenediazonium, and 3-(2-octyloxyethoxy)-4-morpholinobenzenediazonium can be also used.

When the azo-based gas-generating agent (azo compound) is irradiated with light having a wavelength in an ultraviolet region of mainly about 365 nm (e.g., 360 nm to 370 nm), decomposition or the like is induced to thereby generate a nitrogen gas.

In the invention, as the gas-generating agent (especially, the azo-based gas-generating agent), one having a 10-hour half-life temperature of 80° C. or higher can be suitably used. When the 10-hour half-life temperature of the gas-generating agent is 80° C. or higher, thermal stability is excellent and excellent stability can be exhibited in use (especially, use at a high temperature) and during storage. In this connection, if the 10-hour half-life temperature is lower than 80° C., at the time when a pressure-sensitive adhesive is applied on a base material and dried to form an active energy ray-curable pressure-sensitive adhesive layer, there may occur in some cases gas generation owing to decomposition or the like induced by the action of the temperature at drying, bleeding-out of decomposition residues owing to occurrence of decomposition or the like with time, floating at the interface with the adhered owing to gas generation through occurrence of decomposition or the like with time, or the like.

The gas-generating agent is desirably contained in a state that it is dissolved in the active energy ray-curable pressure-sensitive adhesive layer. When the gas-generating agent is not dissolved in the active energy ray-curable pressure-sensitive adhesive layer and present as solid particles, the gas locally generated may foam the active energy ray-curable pressure-sensitive adhesive layer and the gas generated may become difficult to release to outside of the active energy ray-curable pressure-sensitive adhesive layer (i.e., to the interface between the active energy ray-curable pressure-sensitive adhesive layer and the die-adhering layer). Moreover, there is a case where light does not reach inside of the active energy ray-curable pressure-sensitive adhesive layer and the gas-generating efficiency decreases due to light scattering induced by the particulate gas-generating agent at the time of light irradiation as a gas generating means. Furthermore, there is a case where surface smoothness of the active energy ray-curable pressure-sensitive adhesive layer may decrease. In this connection, the dissolution of the gas-generating agent in the active energy ray-curable pressure-sensitive adhesive layer can be confirmed by the fact that the particles of the gas-generating agent cannot be observed when the active energy ray-curable pressure-sensitive adhesive layer is observed with an electron microscope.

In the invention, it is important to use the gas-generating agent in a ratio of 10 parts by weight to 200 parts by weight based on 100 parts by weight of a base polymer in the pressure-sensitive adhesive for forming the active energy ray-curable pressure-sensitive adhesive layer. The content of the gas-generating agent in the active energy ray-curable pressure-sensitive adhesive layer is preferably 30 parts by weight to 100 parts by weight based on 100 parts by weight of the base polymer. Particularly, the content of 50 parts by weight to 100 parts by weight is suitable. When the amount of the gas-generating agent to be used is less than 10 parts by weight based on 100 parts by weight of the base polymer of the active energy ray-curable pressure-sensitive adhesive layer, the amount of the gas generated is small at the time when the gas is generated by applying a gas-generating means to the dicing die-bonding film and thus the active energy ray-curable pressure-sensitive adhesive layer cannot be peeled from the die-adhering layer in some cases. On the other hand, when the content of the gas-generating agent is more than 200 parts by weight based on 100 parts by weight of the base polymer of the active energy ray-curable pressure-sensitive adhesive layer, the amount of the gas-generating agent is excessively large and there is a possibility that the gas-generating agent does not homogeneously dissolve in the active energy ray-curable pressure-sensitive adhesive layer to cause bleeding-out, so that the surface smoothness of the active energy ray-curable pressure-sensitive adhesive layer is lost to impair the adhesiveness to the die-adhering layer.

(Active Energy Ray-Curable Pressure-Sensitive Adhesive)

In the pressure-sensitive adhesive (active energy ray-curable pressure-sensitive adhesive) for forming the active energy ray-curable pressure-sensitive adhesive layer, the following acrylic polymer A is used as a base polymer.

Acrylic polymer A: an acrylic polymer having a constitution that a polymer composed of a monomer composition containing 50% by weight or more of an acrylic acid ester represented by $CH_2=CHCOOR$ (wherein R is an alkyl group having 6 to 10 carbon atoms) and 10% by weight to 30% by weight of a hydroxyl group-containing monomer and containing no carboxyl group-containing monomer is addition reacted with an isocyanate compound having a radical-reactive carbon-carbon double bond in an amount of 50 mol % to 95 mol % based on the hydroxyl group-containing monomer.

The acrylic polymer A is used as a base polymer or a main polymer component of the pressure-sensitive adhesive (active energy ray-curable pressure-sensitive adhesive). In the acrylic polymer A, as a main monomer component, an alkyl acrylate represented by the chemical formula $CH_2=CHCOOR$ (wherein R is an alkyl group having 6 to 10 carbon atoms) (sometimes referred to as "C6-10 alkyl acrylate") is used. When an alkyl acrylate having an alkyl group containing less than 6 carbon atoms is used as a main monomer component, the peeling force becomes too large and there is a case where the pick-up properties decrease. On the other hand, when an alkyl acrylate having an alkyl group containing more than 10 carbon atoms is used as a main monomer component, the adhesiveness with the die-bonding film decreases and, as a result, there is a case where chip fly is generated at the dicing.

Specifically, examples of the C6-10 alkyl acrylate include hexyl acrylate, heptyl acrylate, octyl acrylate, isooctyl acrylate, 2-ethylhexyl acrylate, nonyl acrylate, isononyl acrylate, decyl acrylate, and isodecyl acrylate. As the C6-10 alkyl acrylate, alkyl acrylates having an alkyl group containing 8 to 9 carbon atoms are particularly preferred. Of these, 2-ethylhexyl acrylate and isooctyl acrylate are most suitable. The C6-10 alkyl acrylate can be used alone or two or more types may be used in combination.

Further, in the invention, the content of the C6-10 alkyl acrylate ester is importantly 50% by weight (wt %) or more and preferably 70 wt % to 90 wt %, based on the whole amount of the monomer components. When the content of the C6-10 alkyl acrylate is less than 50 wt % based on the whole amount of the monomer components, the peeling force becomes too large, and there is a case where the pick-up properties decrease.

As the acrylic polymer A, an acrylic acid ester other than the C6-10 alkyl acrylate may be used as a monomer component. Examples of such an acrylic acid ester include alkyl acrylates other than the C6-10 alkyl acrylate, acrylic acid esters having an aromatic ring (aryl acrylates such as phenyl acrylate, etc.), and acrylic acid esters having an alicyclic hydrocarbon group (cycloalkyl acrylates such as cyclopentyl acrylate and cyclohexyl acrylate, isobornyl acrylate, etc.). Alkyl acrylates and cycloalkyl acrylates are suitable and particularly, alkyl acrylates can be suitably used. The acrylic acid esters can be used alone or two or more types may be used in combination.

Examples of the alkyl acrylates (alkyl acrylates other than C6-10 alkyl acrylates) include alkyl acrylates having an alkyl group containing 5 or less carbon atoms, such as methyl acrylate, ethyl acrylate, propyl acrylate, isopropyl acrylate, butyl acrylate, isobutyl acrylate, s-butyl acrylate, t-butyl acrylate, pentyl acrylate, and isopentyl acrylate; alkyl acrylates having an alkyl group containing 11 or more (preferably 11 to 30) carbon atoms, such as undecyl acrylate, dodecyl acrylate, tridecyl acrylate, tetradecyl acrylate, hexadecyl acrylate, octadecyl acrylate, and eicosyl acrylate.

The alkyl acrylates such as C6-10 alkyl acrylates may be any form of alkyl acrylates, such as straight chain alkyl acrylates or branched chain alkyl acrylates.

In the invention, the acrylic polymer A contains a hydroxyl group-containing monomer copolymerizable with the C6-10 alkyl acrylate. Examples of the hydroxyl group-containing monomer include 2-hydroxyethyl(meth)acrylate, 2-hydroxypropyl(meth)acrylate, 4-hydroxybutyl(meth)acrylate, 6-hydroxyhexyl (meth)acrylate, 8-hydroxyoctyl(meth)acrylate, 10-hydroxydecyl(meth)acrylate, 12-hydroxylauryl(meth)acrylate, and (4-hydroxymethylcyclohexyl)methyl(meth)acrylate. The hydroxyl group-containing monomer can be used alone or two or more types can be used in combination.

The content of the hydroxyl group-containing monomer is importantly in the range of 10 wt % to 30 wt %, and preferably in the range of 15 wt % to 25 wt % based on the whole amount of the monomer components. When the content of the hydroxyl group-containing monomer is less than 10 wt % based on the whole amount of the monomer components, crosslinking is insufficient and the pick-up properties decrease. On the other hand, when the content of the hydroxyl group-containing monomer exceeds 30 wt % based on the whole amount of the monomer components, polarity of the pressure-sensitive adhesive becomes high and its interaction with the die-adhering layer (die-bonding film) becomes high, so that peeling becomes difficult (the pick-up properties decrease).

The acrylic polymer A may contain unit(s) corresponding to other monomer component(s) (sometimes referred to as "copolymerizable other monomer component(s)") copolymerizable with the C6-10 alkyl acrylates and hydroxyl group-containing monomers according to needs for the purpose of modification of cohesion force, heat resistance, and the like. However, in the invention, it is important that a carboxyl group-containing monomer is not used. When the carboxyl group-containing monomer is used, the active energy ray-curable pressure-sensitive adhesive layer of the dicing film and the die-adhering layer (die-bonding film) strongly adhere to each other and peeling becomes impossible in some cases. As such a carboxyl group-containing monomer, there may be mentioned acrylic acid, methacrylic acid, carboxyethyl (meth)acrylate, carboxypentyl(meth)acrylate, itaconic acid, maleic acid, fumaric acid, crotonic acid, and the like.

Examples of the copolymerizable other monomer components include methacrylates such as methyl methacrylate, ethyl methacrylate, propyl methacrylate, isopropyl methacrylate, butyl methacrylate, isobutyl methacrylate, s-butyl methacrylate, and t-butyl methacrylate; acid anhydride monomers such as maleic anhydride and itaconic anhydride; sulfonic acid group-containing monomers such as styrenesulfonic acid, allylsulfonic acid, 2-(meth)acrylamide-2-methylpropanesulfonic acid, (meth)acrylamidepropanesulfonic acid, sulfopropyl(meth)acrylate, and (meth)acryloyloxynaphthalenesulfonic acid; phosphoric acid group-containing monomers such as 2-hydroxyethylacryloyl phosphate; styrene-based monomers such as styrene, vinyltoluene, and α-methylstyrene; olefins or dienes such as ethylene, butadiene, isoprene, and isobutylene; halogen atom-containing monomers such as vinyl chloride; fluorine atom-containing monomers such as fluorinated (meth)acrylates; acrylamide; and acrylonitrile.

One type or two types or more of the copolymerizable other monomer components can be used. The amount of these copolymerizable monomers to be used is preferably 40 wt % or less of the whole amount of the monomer components.

Moreover, in the invention, an isocyanate compound having a radical-reactive carbon-carbon double bond (sometimes referred to as "double bond-containing isocyanate compound") is used in the acrylic polymer A. The acrylic polymer A has a constitution that a double bond-containing isocyanate compound is incorporated into a polymer derived from a monomer composition containing the C6-10 alkyl acrylate, the hydroxyl group-containing monomer, etc. through an addition reaction. Therefore, the acrylic polymer A has a radical-reactive carbon-carbon double bond in its molecular structure. Thereby, the polymer can form an active energy ray-curable pressure-sensitive adhesive layer (such as ultraviolet ray-curable pressure-sensitive adhesive layer) that is cured by active energy ray (such as an ultraviolet ray) irradiation and thus not only the peeling force between the die-adhering layer and the active energy ray-curable pressure-sensitive adhesive layer can be decreased but also, after a gas is generated from the gas-generating agent and the die-adhering layer is peeled from the active energy ray-curable pressure-sensitive adhesive layer, the re-adhesion of the die-adhering layer to the active energy ray-curable pressure-sensitive adhesive layer can be prevented.

In this connection, generally, in order to impart an active energy ray curability such as an ultraviolet ray curability to the pressure-sensitive adhesive layer, there may be mentioned a method of using an internally provided type ultraviolet ray-curable base polymer wherein the radical-reactive carbon-carbon double bond is contained in the polymer side chain, in the main chain, or at the end of the main chain, a method of mixing an ultraviolet ray curable monomer component or oligomer component into the pressure-sensitive adhesive layer, and the like method. However, there is a possibility that the oligomer component or the like that is a low-molecular-weight component may migrate in the pressure-sensitive adhesive layer with time and thus a pressure-sensitive adhesive layer having a stable layer structure cannot be formed, so that the above-mentioned internally provided type active energy ray-curable base polymer (such as ultraviolet ray curable base polymer) is preferably used as a base polymer of the pressure-sensitive adhesive.

Examples of the double bond-containing isocyanate compound include methacryloyl isocyanate, acryloyl isocyanate, 2-methacryloyloxyethyl isocyanate, 2-acryloyloxyethyl isocyanate, and m-isopropenyl-α,α-dimethylbenzyl isocyanate. The double bond-containing isocyanate compound can be used alone or two or more types can be used in combination.

The amount of the double bond-containing isocyanate compound to be used is preferably in the range of 50 to 95 mol %, and more preferably in the range of 75 to 90 mol % based on the hydroxyl group-containing monomer. When the amount of the double bond-containing isocyanate compound to be used is less than 50 mol % based on the hydroxyl group-containing monomer, there is a case where the crosslinking after active energy ray irradiation becomes insufficient to cause decrease in pick-up properties or generation of adhesive residue on the semiconductor chip having the die-bonding film attached thereto (die-adhering layer).

The method of introducing the radical-reactive carbon-carbon double bond into the acrylic polymer A is not particularly limited, and various methods can be adopted. For example, there may be mentioned a method including copolymerizing a monomer having a hydroxyl group with the acrylic polymer in advance and then performing a condensation or addition reaction with an isocyanate compound having an isocyanate group that can react with the hydroxyl group and a radical-reactive carbon-carbon double bond (i.e., above-mentioned double bond-containing isocyanate compound) while keeping the active energy ray curability of the radical-reactive carbon-carbon double bond. In this connection, the acrylic polymer A may be a polymer wherein, besides the hydroxyl group-containing monomer exemplified above, a hydroxyl group-containing ether-based compound (ether-based hydroxyl group-containing monomer) such as 2-hydroxyethyl vinyl ether, 4-hydroxybutyl vinyl ether, or diethylene glycol monovinyl ether or the like is copolymerized.

The acrylic polymer A can be obtained by polymerizing a single monomer or a monomer mixture of two or more types. The polymerization can be performed by any of methods such as solution polymerization (e.g., radical polymerization, anion polymerization, cation polymerization, etc.), emulsion polymerization, bulk polymerization, suspension polymerization, and photopolymerization (e.g., ultraviolet ray (IJV) polymerization, etc.). From the viewpoint of preventing the contamination of a clean adhered, the content of low-molecular-weight substances is preferably small. From this viewpoint, the weight average molecular weight of the acrylic polymer is preferably 350,000 to 1,000,000, and more preferably about 450,000 to 800,000.

Moreover, in the pressure-sensitive adhesive (active energy ray-curable pressure-sensitive adhesive) for forming the active energy ray-curable pressure-sensitive adhesive layer, in order to control the pressure-sensitive adhesive force before and after the active energy ray irradiation, an external crosslinking agent can be optionally used. As a specific means for the external crosslinking method, there may be mentioned a method of adding and reacting a so-called crosslinking agent such as a polyisocyanate compound, an epoxy compound, an aziridine compound, or a melamine-based crosslinking agent. In the case where the external crosslinking agent is used, the amount is appropriately decided depending on the balance with the base polymer to be crosslinked and further the use application as a pressure-sensitive adhesive. The amount of the external crosslinking agent to be used is 20 parts by weight or less and preferably 0.1 part by weight to 10 parts by weight based on 100 parts by weight of the base polymer. Furthermore, the pressure-sensitive adhesive may be mixed with conventionally known various additives such as tackifiers and antiaging agents other than the above-mentioned components.

In the active energy ray-curable pressure-sensitive adhesive, the base polymer having a radical-reactive carbon-carbon double bond (acrylic polymer A) can be used alone but an active energy ray-curable monomer component and an active energy ray-curable oligomer component may be mixed in such a degree that the properties are not deteriorated.

Examples of the active energy ray-curable monomer component include urethane oligomers, urethane (meth)acrylates, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butanediol di(meth)acrylate. Further, the active energy ray-curable oligomer component includes various types of oligomer components such as urethane-based, polyether-based, polyester-based, polycarbonate-based, and polybutadiene-based oligomers, and its molecular weight is appropriately in the range of about 100 to 30,000. The mixing amount of the active energy ray-curable monomer component or active energy ray-curable oligomer component can be appropriately determined depending on the type of the active energy ray-curable pressure-sensitive adhesive layer. Generally, the mixing amount of the active energy ray-curable monomer component or active energy ray-curable oligomer component is, for example, 500 parts by weight or less (e.g., 0 to 500 parts by weight, and preferably 0 to 150 parts by weight) based on 100 parts by weight of the base polymer constituting the active energy ray-curable pressure-sensitive adhesive, such as acrylic polymer.

A photopolymerization initiator may be used in the active energy ray-curable pressure-sensitive adhesive for the purpose of curing with an active energy ray.

Examples of the photopolymerization initiator include α-ketol-based compounds such as 4-(2-hydroxyethoxy)phenyl (2-hydroxy-2-propyl)ketone, α-hydroxy-α,α'-dimethylacetophenone, 2-methyl-2-hydroxypropiophenone, and 1-hydroxycyclohexyl phenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1-one; benzoin ether-based compounds such as benzoin ethyl ether, benzoin isopropyl ether, and anisoin methyl ether; ketal-based compounds such as benzyl dimethyl ketal; aromatic sulfonyl chloride-based compounds such as 2-naphthalenesulfonyl chloride; photoactive oxime-based compounds such as 1-phenone-1,1-propanedione-2-(o-ethoxycarbonyl) oxime; benzophenone-based compounds such as benzophenone, benzoylbenzoic acid and 3,3'-dimethyl-4-methoxybenzophenone; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphor quinone; halogenated ketones; acylphosphinoxides; and acylphosphonates. The mixing amount of the photopolymerization initiator is for example, 20 parts by weight or less (e.g., 0.05 to 20 parts by weight) based on 100 parts by weight of the base polymer that constitutes the pressure-sensitive adhesive, such as an acrylic polymer.

In the invention, as a pressure-sensitive adhesive layer for forming the active energy ray-curable pressure-sensitive adhesive layer, together with the pressure-sensitive adhesive containing the above-mentioned acrylic polymer A as a base polymer, other acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and the like can be used singly or in combination of two or more thereof according to needs.

Moreover, as the active energy ray-curable pressure-sensitive adhesive, for example, acryl-based pressure-sensitive adhesives and rubber-based pressure-sensitive adhesives containing an addition polymerizable compound having two or more unsaturated bonds, a photopolymerizable compound such as an alkoxysilane having an epoxy group, and a photopolymerization initiator such as a carbonyl compound, an organic sulfur compound, a peroxide, an amine, and an onium salt-based compound, which are disclosed in JP-A-60-196956, which is herein incorporated by reference, can be used singly or in combination of two or more thereof according to needs.

The active energy ray-curable pressure-sensitive adhesive layer can be formed, for example, by utilizing a commonly used method including mixing an active energy ray-curable pressure-sensitive adhesive and a gas-generating agent as well as a solvent and other additives according to needs and forming the mixture into a sheet-shaped layer. Specifically, the active energy ray-curable pressure-sensitive adhesive layer can be formed, for example, by a method including applying a mixture containing an active energy ray-curable pressure-sensitive adhesive, a gas-generating agent, and a solvent and other additives according to needs onto a base material or an intermediate layer to be mentioned below, a method including applying the above mixture onto an appropriate separator (such as a releasing paper) to form an active energy ray-curable pressure-sensitive adhesive layer and transferring (transcribing) it onto a base material or an intermediate layer, or the like method. In this connection, in the case where a heat-drying step or the like is involved in the production process of the dicing film, the temperature in the heat-drying step is desirably a temperature at which a gas is not generated from the gas-generating agent in the active energy ray-curable pressure-sensitive adhesive layer.

The thickness of the active energy ray-curable pressure-sensitive adhesive layer is not particularly limited and, for example, is about 1 μm to 50 μm, preferably 2 μm to 30 μm, and more preferably 5 μm to 25 μm. When the thickness of the active energy ray-curable pressure-sensitive adhesive layer is exceedingly thin, the adhesiveness to the die-adhering layer decreases. On the other hand, when the thickness of the active energy ray-curable pressure-sensitive adhesive layer is exceedingly thick, dicing accuracy at dicing decreases.

Incidentally, the active energy ray-curable pressure-sensitive adhesive layer may be either a single layer or a multi layer.

In the invention, the active energy ray-curable pressure-sensitive adhesive layer may contain various additives (e.g., colorants, thickeners, extenders, fillers, tackifiers, plasticizers, antiaging agents, antioxidants, surfactants, crosslinking agents, etc.) within the range where the advantages of the invention are not impaired.

The active energy ray-curable pressure-sensitive adhesive layer can be cured by irradiation with an active energy ray. Moreover, in the case where the gas-generating agent is a gas-generating agent which generates a gas by light (light irradiation-type gas-generating agent), a gas can be generated by irradiation with an active energy ray. In this case, by irradiating the active energy ray-curable pressure-sensitive adhesive layer with an active energy ray (such as an ultraviolet ray), curing of the pressure-sensitive adhesive layer and gas generation by the gas-generating agent in the pressure-sensitive adhesive layer are induced, so that the die-bonding film can be peeled from the dicing film and the semiconductor chip can be easily picked up in the picking-up step.

As such an active energy ray, there may be, for example, mentioned ionizing radiations such as α-ray, β-ray, γ-ray, neutron beam, and electron beam and ultraviolet rays. Particularly, ultraviolet rays are suitable. Irradiation energy, irradiation time, and irradiation method when the active energy ray is irradiated are not particularly limited and are suitably selected so as to be able to activate a photopolymerization initiator to cause a curing reaction and so as to be able to induce gas generation in the case where the gas-generating agent is a light irradiation-type gas-generating agent which generates a gas by active energy ray irradiation. In the case where an ultraviolet ray is adopted as the active energy ray, as ultraviolet irradiation, for example, irradiation of an ultraviolet ray whose luminance at a wavelength of 300 nm to 400 nm is 1 mW/cm$^2$ to 200 mW/cm$^2$ is performed at a light intensity of about 400 mJ/cm$^2$ to 4000 mJ/cm$^2$. Moreover, as a light source of the ultraviolet ray, sources having a spectral distribution in the wavelength region of 180 nm to 460 nm, preferably 300 nm to 400 nm are used. For example, an irradiation apparatus such as chemical lamp, black light, mercury arc, carbon arc, low-pressure mercury lamp, medium-pressure mercury lamp, high-pressure mercury lamp, ultrahigh-pressure mercury lamp, metal halide lamp, or the like can be used. In this connection, as the light source of the ultraviolet ray, an irradiation apparatus capable of generating an ionizing radiation having a longer or shorter wavelength than the above wavelength may be used.

Incidentally, in the case of the gas-generating agent (heating-type gas-generating agent) wherein the gas-generating agent generates a gas by heat, the heating treatment can be performed, for example, utilizing an appropriate heating means such as a hot plate, a hot-air drier, a near-infrared lamp, or an air drier. The heating temperature at the heating treatment may be a gas-generation initiating temperature of the gas-generating agent in the active energy ray-curable pressure-sensitive adhesive layer or higher. The conditions for the heating treatment can be appropriately set depending on the kind of the heating-type gas-generating agent, heat resistance of the base material, the die-bonding film, semiconductor wafer, etc., heating methods (heat capacity, heating means, etc.), and the like. General conditions for the heating treatment are as follows: temperature of 100° C. to 250° C. for 1 second to 90 seconds (hot plate and the like) or 5 minutes to 15 minutes (hot-air drier and the like). The heating treatment can be performed at an appropriate stage depending on the intended purpose of use. Moreover, there are cases where an infrared lamp or heated water can be used as a heat source at the heating treatment.

Incidentally, the active energy ray irradiation of the active energy ray-curable pressure-sensitive adhesive layer containing the light irradiation-type gas-generating agent can be performed at least partially. For example, by irradiating the dicing die-bonding film at least partially at any time in the state that an adhered (particularly plural pieces of the adhered) is attached on the pressure-sensitive adhesive surface of the active energy ray-curable pressure-sensitive adhesive layer through the die-bonding film, at least partial curing and gas generation occur in the active energy ray-curable pressure-sensitive adhesive layer. Owing to this at least partial curing and gas generation of the active energy ray-curable pressure-sensitive adhesive layer, the gas migrates (invades) into the interface between the pressure-sensitive adhesive surface of the active energy ray-curable pressure-sensitive adhesive layer and the die-adhering layer of the die-bonding film to reduce the adhesive area between the pressure-sensitive adhesive surface and the die-bonding film on which the adhered has been attached. Consequently, the adhesive force between the pressure-sensitive adhesive surface and the die-bonding film on which the adhered has been attached is decreased and thus the die-bonding film (die-bonding film having the adhered attached thereto) attached on the pressure-sensitive adhesive surface can be peeled from the dicing film. In the case where the active energy ray-curable pressure-sensitive adhesive layer is partially irradiated with an active energy ray, the part to be partially irradiated with the active energy ray may be a part containing at least the part on which the semiconductor chip to be peeled or picked up is attached through the die-bonding film.

(Gel Fraction)

The gel fraction of the active energy ray-curable pressure-sensitive adhesive layer after curing by active energy ray irradiation is preferably 90% by weight or more, more preferably 94% by weight or more. When the gel fraction of the active energy ray-curable pressure-sensitive adhesive layer after active energy ray curing is less than 90% by weight, the pick-up properties decrease and adhesive residue may be generated on the semiconductor chip having the die-bonding film attached thereto in some cases.

The gel fraction (insoluble content fraction) of the active energy ray-curable pressure-sensitive adhesive layer can be measured by the following measurement method.

Measurement Method of Gel Fraction

About 0.1 g was sampled from the active energy ray-curable pressure-sensitive adhesive layer subjected to ultraviolet ray irradiation (wavelength: 365 nm) at an ultraviolet ray irradiation integrated light intensity of 1,000 mJ/m$^2$ using an ultraviolet ray (UV) irradiation apparatus of a trade name "UM-810" manufactured by Nitto Seiki Co., Ltd. and was precisely weighed (sample weight). After wrapped with a mesh sheet, it was immersed in about 50 ml of ethyl acetate at room temperature for 1 week. Thereafter, a solvent-insoluble content (a content in the mesh sheet) was taken out of the ethyl acetate and dried at 80° C. for about 2 hours, the solvent-insoluble content was weighed (weight after immersion and drying), and a gel fraction (% by weight) was calculated according to the following equation (1).

Gel fraction (% by weight)={(Weight after immersion and drying)/(Sample weight)}×100    (1)

(Elastic Modulus)

The elastic modulus (temperature: 23° C., drawing rate: 50 mm/min, distance between chucks: 10 mm) of the active energy ray-curable pressure-sensitive adhesive layer after curing by active energy ray irradiation is desirably 10 MPa or more and further preferably 12 MPa or more. In this connection, an upper limit of the elastic modulus (temperature: 23° C., drawing rate: 50 mm/min, distance between chucks: 10 mm) of the active energy ray-curable pressure-sensitive adhesive layer after curing by active energy ray irradiation is not particularly limited and, for example, may be 50 MPa or less, preferably 40 MPa or less, and further preferably 35 MPa or less. Thus, when the elastic modulus (temperature: 23° C., drawing rate: 50 mm/min, distance between chucks: 10 mm) of the active energy ray-curable pressure-sensitive adhesive layer after curing by active energy ray irradiation is 10 MPa or more, the re-adhesion of the active energy ray-curable pressure-sensitive adhesive layer to the die-adhering layer can be effectively prevented at the time when a gas is generated from the gas-generating agent by applying a gas-generation means to the dicing film to peel the dicing film from the die-adhering layer.

The elastic modulus (temperature: 23° C., drawing rate: 50 mm/min, distance between chucks: 10 mm) of the active energy ray-curable pressure-sensitive adhesive layer after curing by active energy ray irradiation can be measured by the following measurement method.

Measurement Method of Elastic Modulus

Ultraviolet ray (UV) irradiation (wavelength: 365 nm) is applied to a dicing film (pressure-sensitive adhesive sheet) before lamination with the die-adhering layer using an ultraviolet ray (UV) irradiation apparatus of a trade name "UM-810" manufactured by Nitto Seiki Co., Ltd, under a condition of an ultraviolet ray irradiation integrated light intensity of 1,000 mJ/m². Only the pressure-sensitive adhesive layer (active energy ray-curable pressure-sensitive adhesive layer) after ultraviolet ray irradiation is separated and a tensile test is performed at a distance between chucks of 10 mm and a test speed (drawing rate) of 50 mm/min using a tensile tester (trade name "Autograph AG-IS" manufactured by Shimadzu Corporation) under the environment of the test place (23±2° C., 50±5% RH) described in JIS Z 8703. Then, an elastic modulus (initial elastic modulus) was determined from the slope of the tangent line of low strain region part of the obtained stress-strain curve.

The elastic modulus of the active energy ray-curable pressure-sensitive adhesive layer can be controlled by adjusting the cured state by the active energy ray curing, the kind of the base polymer of the pressure-sensitive adhesive, the crosslinking agent, the additives, and the like.

Moreover, in the invention, the active energy ray-curable pressure-sensitive adhesive layer preferably has a surface free energy of 35 mJ/m² or less (e.g., 1 mJ/m² to 35 mJ/m²) on the surface where the die-bond film is formed, particularly the surface of the site coming into contact with the die-bonding film. The surface free energy of the active energy ray-curable pressure-sensitive adhesive layer is further preferably 15 mJ/m² to 33 mJ/m², and particularly preferably 25 mJ/m² to 30 mJ/m². In the case where the surface free energy of the active energy ray-curable pressure-sensitive adhesive layer exceeds 35 mJ/m², adhesiveness between the active energy ray-curable pressure-sensitive adhesive layer and the die-bonding film increases and the pick-up properties may decrease in some cases. In this connection, the surface free energy (mJ/m²) of the active energy ray-curable pressure-sensitive adhesive layer is surface free energy of the active energy ray-curable pressure-sensitive adhesive layer before the active energy ray curing.

In the invention, the surface free energy of the active energy ray-curable pressure-sensitive adhesive layer means a surface free energy value ($\gamma_S$) determined by measuring individual contact angles θ (rad) of water and methylene iodide against the surface of the active energy ray-curable pressure-sensitive adhesive layer and solving two equations as simultaneous linear equations obtained utilizing the measured values and values known from literatures as surface free energy values of the contact angle-measured liquids {water (dispersing component ($\gamma_L^d$): 21.8 (mJ/m²), polar component ($\gamma_L^p$): 51.0 (mJ/m²)), methylene iodide (dispersing component ($\gamma_L^d$): 49.5 (mJ/m²), polar component ($\gamma_L^p$): 1.3 (mJ/m²))} and the following equations (2a) to (2c).

$$\gamma_S = \gamma_S^d + \gamma_S^p \quad (2a)$$

$$\gamma_L = \gamma_L^d + \gamma_L^p \quad (2b)$$

$$(1+\cos\theta)\gamma_L = 2(\gamma_S^d\gamma_L^d)^{1/2} + 2(\gamma_S^p\gamma_L^p)^{1/2} \quad (2c)$$

wherein respective symbols in the equations (2a) to (2c) are as follows, respectively.

θ: contact angle measured with a liquid drop of water or methylene iodide (rad)

$\gamma_S$: surface free energy of the pressure-sensitive adhesive layer (active energy ray-curable pressure-sensitive adhesive layer) (mJ/m²)

$\gamma_S^d$: dispersing component in surface free energy of the pressure-sensitive adhesive layer (active energy ray-curable pressure-sensitive adhesive layer) (mJ/m²)

$\gamma_S^p$: polar component in surface free energy of the pressure-sensitive adhesive layer (active energy ray-curable pressure-sensitive adhesive layer) (mJ/m²)

$\gamma_L$: surface free energy of water or methylene iodide (mJ/m²)

$\gamma_L^d$: dispersing component in surface free energy of water or methylene iodide (mJ/m²)

$\gamma_L^p$: polar component in surface free energy of water or methylene iodide (mJ/m²)

Moreover, the contact angle of water or methylene iodide against the surface of the active energy ray-curable pressure-sensitive adhesive layer was determined by dropping a liquid droplet of about 1 μL of water (distilled water) or methylene iodide onto the surface of the active energy ray-curable pressure-sensitive adhesive layer under the environment of the test place (temperature: 23±2° C., humidity: 50±5% RH) described in JIS Z 8703 and measuring the angle by three point method after 30 seconds from the dropping using a surface contact angle meter "CA-X" (manufactured by FACE Company).

The surface free energy of the active energy ray-curable pressure-sensitive adhesive layer can be controlled by adjusting the kind of the base polymer of the pressure-sensitive adhesive, additives, and the like.

Furthermore, in the invention, the base polymer of the pressure-sensitive adhesive which forms the active energy ray-curable pressure-sensitive adhesive layer desirably has a glass transition temperature (Tg) of −80° C. or higher and −30° C. or lower. When the glass transition temperature of the base polymer is lower than −80° C., it becomes difficult to produce such a polymer. On the other hand, when the glass transition temperature of the base polymer is higher than −30° C., the adhesiveness between the active energy ray-curable pressure-sensitive adhesive layer of the dicing film and the die-adhering layer increases and thus the peeling ability decreases.

Incidentally, the glass transition temperature of the base polymer is regarded as a value determined as follows. As the pressure-sensitive adhesive layer (active energy ray-curable pressure-sensitive adhesive layer) of the dicing film (pressure-sensitive adhesive sheet), a similar pressure-sensitive adhesive layer (sample) is prepared in the same manner except that the gas-generating agent is not contained, and measurement is performed at a sample thickness of about 1.5 mm using a jig of a parallel plate of 7.9 mm$\phi$ in a shear mode at a frequency of 1 Hz and a temperature-elevating rate of 5° C./minute using a dynamic viscoelasticity measuring apparatus (trade name "ARES" manufactured by Rheometrics Co., Ltd.). In the obtained spectrum of shear loss modulus G", a temperature at which elastic modulus rapidly changes from a high elastic modulus to a low elastic modulus is regarded as the glass transition temperature (Tg) of the base polymer.

The glass transition temperature of the base polymer can be controlled by adjusting the kinds of the monomers, kinds and amounts of various additives, and the like.

(Intermediate Layer)

In the invention, an intermediate layer may be provided between the base material and the active energy ray-curable pressure-sensitive adhesive layer. As such an intermediate layer, there may be mentioned a coating layer of an undercoating agent for the purpose of improving the adhesive force. In addition, examples of the intermediate layer other than the coating layer of an undercoating agent include a layer for the purpose of increasing the adhesion area to the adhered (such as a semiconductor wafer), a layer for the purpose of improving the adhesive force, and a layer for the purpose of achieving a good following ability to the surface shape of the adhered (such as a semiconductor wafer).

The thickness of the intermediate layer is not particularly limited and is, for example, about 5 μm to 300 μm, and preferably about 20 μm to 150 μm.

The intermediate layer may be a single layer or may be constituted by two or more layers. Moreover, as the intermediate layer, it is preferable to use a layer which does not inhibit transmittance of the active energy ray.

Incidentally, the intermediate layer may contain various additives (e.g., colorants, thickeners, extenders, fillers, tackifiers, plasticizers, antiaging agents, antioxidants, surfactants, crosslinking agents, etc.) within the range where the advantages of the invention are not impaired.

(Base Material)

The base material of the dicing film (pressure-sensitive adhesive sheet) according to the invention is not particularly limited but is preferably one which transmits or passes light (particularly an ultraviolet ray) in the case where a gas is generated by light from the gas-generating agent contained in the active energy ray-curable pressure-sensitive adhesive layer or from the viewpoint of curing the active energy ray-curable pressure-sensitive adhesive layer by an active energy ray (such as an ultraviolet ray). Moreover, the base material is a strength matrix of the dicing die-bonding film. The base material is not particularly limited as long as it has an ability to transmit an active energy ray. Examples thereof include polyolefins such as low-density polyethylene, straight chain polyethylene, medium-density polyethylene, high-density polyethylene, very low-density polyethylene, random copolymer polypropylene, block copolymer polypropylene, homopolypropylene, polybutene, and polymethylpentene; ethylene-vinylacetate copolymers; ionomer resins; ethylene-(meth)acrylic acid copolymers; ethylene-(meth)acrylate ester (random or alternating) copolymers; ethylene-butene copolymers; ethylene-hexene copolymers; acrylic resins; polyurethanes; polyesters such as polyethylene terephthalate and polyethylene naphthalate; polycarbonates; polyimides; polyether ether ketones; polyetherimide; polyamide; whole aromatic polyamides; polyphenyl sulfide; aramid (paper); glass; glass cloth; fluorinated resins; polyvinyl chloride; polyvinylidene chloride; ABS (acrylonitrile-butadiene-styrene copolymer); cellulose-based resins; silicone resins; metal (foil); and paper. Moreover, as the material of the base material, a polymer such as a cross-linked body of each of the above resins can be also used.

A plastic film composed of each of the resins may be used unstretched, or may be used after a monoaxial or biaxial stretching treatment is applied according to needs.

As the base material, a sheet formed of a transparent resin, a sheet having a reticulate structure, a sheet on which holes are opened is suitable.

A commonly used surface treatment, e.g., a chemical or physical treatment such as a chromate treatment, ozone exposure, flame exposure, exposure to high-voltage electric shock, or an ionizing radiation treatment, and a coating treatment with an undercoating agent (for example, a tacky substance to be described later) can be applied on the surface of the base material in order to improve the adhesiveness to the adjacent layer, the holding properties, etc.

The same type or different type of resins can be appropriately selected and used for forming the base material, and a blended resin in which resins of plural types are blended may be used according to needs. Further, a vapor-deposited layer of a conductive substance composed of a metal, an alloy, an oxide thereof, etc. and having a thickness of about 30 to 500 Angstrom may be provided on the base material in order to impart an antistatic function to the base material. The base material may have a form of a single layer or a multi layer composed of two or more types.

The thickness of the base material can be appropriately determined without particular limitation. However, it is generally about 5 μm to 200 μm. When the thickness of the base material is less than 5 μm, a self-supporting property of the dicing film or dicing die-bonding film becomes insufficient and thus the handling may become difficult in some cases. When the thickness exceeds 200 μm, inconvenience in picking-up may occur since expanding at dicing is not satisfactorily performed.

Incidentally, the base material may contain various additives (colorants, fillers, plasticizers, antiaging agents, antioxidants, surfactants, flame retardants, etc.) within the range where the advantages and the like of the invention are not impaired.

(Die-Bonding Film)

In the invention, the die-bonding film is formed of the die-adhering layer.

It is important that the die-bonding film has a function of adhering and supporting a semiconductor wafer during processing of the semiconductor wafer (e.g., cutting thereof into a chip form) which is press-bonded on the die-bonding film and a function of acting as an adhering layer of the processed body of the semiconductor wafer (e.g., a semiconductor chip cut into a chip form) to various carriers when the processed body of the semiconductor wafer is mounted thereon. Particularly, as the die-adhering layer, it is important to have such adhesiveness that cut pieces do not fly during processing of the semiconductor wafer (e.g., processing such as cutting).

The die-adhering layer is an adhesive layer and may be constituted by a single layer of adhesive layer or may be constituted by two or more layers thereof. In the invention, the die-adhering layer is preferably constituted by a resin composition containing an epoxy resin. An epoxy resin is preferable since the content of ionic impurities and the like which corrode a semiconductor element is small. In the resin composition, the ratio of the epoxy resin can be appropriately selected from the range of 5% by weight or more, preferably 7% by weight or more, and more preferably 9% by weight or more based on the whole amount of the polymer components. An upper limit of ratio of the epoxy resin is not particularly limited and may be 100% by weight or less, preferably 50% by weight or less, and more preferably 40% by weight or less based on the whole amount of the polymer components.

The epoxy resin is not particularly limited as long as it is generally used as an adhesive composition. For example, a bifunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin, and a tetraphenylolethane type epoxy resin or an epoxy resin such as a hydantoin type epoxy resin, a trisglycidylisocyanurate type epoxy resin or a glycidylamine type epoxy resin may be used. The epoxy resins can be used alone or two or more types can be used in combination.

As the epoxy resin, among those exemplified above, a novolak type epoxy resin, a biphenyl type epoxy resin, a trishydroxyphenylmethane type epoxy resin, and a tetraphenylolethane type epoxy resin are particularly preferable. This is because these epoxy resins have high reactivity with a phenol resin as a curing agent and are superior in heat resistance and the like.

Moreover, in the die-adhering layer, other thermosetting resins or thermoplastic resins can be used in combination with the epoxy resin according to needs. Examples of the thermosetting resin include phenol resins, amino resins, unsaturated polyester resins, polyurethane resins, silicone resins, and thermosetting polyimide resins. These thermosetting resins can be used alone or two or more types can be used in combination. Further, the curing agent of the epoxy resin is preferably a phenol resin.

Furthermore, the phenol resin acts as a curing agent of the epoxy resin, and examples include novolak type phenol resins such as phenol novolak resins, phenol aralkyl resins, cresol novolak resins, tert-butylphenol novolak resins, and nonylphenol novolak resins; resol type phenol resins; and polyhydroxystyrenes such as poly-p-hydroxystyrene. They can be used alone or two or more types can be used in combination. Among these phenol resins, phenol novolak resins and phenol aralkyl resins are particularly preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside of the range, a sufficient curing reaction does not proceed, and the characteristics of the epoxy resin cured product easily deteriorate.

Examples of the thermoplastic resin include natural rubber, butyl rubber, isoprene rubber, chloroprene rubber, ethylene-vinyl acetate copolymers, ethylene-acrylic acid copolymers, ethylene-acrylate ester copolymers, polybutadiene resin, polycarbonate resins, thermoplastic polyimide resins, polyamide resins such as 6-Nylon and 6,6-Nylon, phenoxy resins, acrylic resins, saturated polyester resins such as PET and PBT, polyamideimide resins, and fluorinated resins. These thermoplastic resins can be used alone or two type or more can be used in combination. Among these thermoplastic resins, acrylic resins are particularly preferable, wherein the ionic impurities are less, the heat resistance is high, and reliability of the semiconductor element can be secured.

The acrylic resins are not particularly limited, and examples thereof include such as polymers containing one type or two types or more of esters of acrylic acid or methacrylic acid having a straight chain or branched alkyl group having 30 or less carbon atoms, particularly 4 to 18 carbon atoms as component(s). Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the esters of acrylic acid or methacrylic acid having 30 or less carbon atoms) are not particularly limited, and examples thereof include carboxyl group-containing monomers such as acrylic acid, methacrylic acid, carboxylethyl acrylate, carboxylpentyl acrylate, itaconic acid, maleic acid, fumaric acid, and chrotonic acid; acid anhydride monomers such as maleic anhydride and itaconic anhydride; hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl (meth)acrylate, 10-hydroxydecyl(meth)acrylate, 12-hydroxylauryl(meth)acrylate, and (4-hydroxymethylcyclohexyl)-methyl acrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; and phosphoric acid group-containing monomers such as 2-hydroxyethylacryloyl phosphate.

In the invention, the thermoplastic resin (particularly, an acrylic resin) can be used in a ratio of less than 90% by weight, e.g., 1% by weight to 90% by weight based on the whole amount of the polymer components. The ratio of the thermoplastic resin such as an acrylic resin is preferably 20% by weight to 85% by weight, and more preferably 40% by weight to 80% by weight based on the whole amount of the polymer components.

In order to perform crosslinking of the die-adhering layer (particularly, die-adhering layer composed of a resin composition containing an epoxy resin) of the die-bonding film to some extent in advance, a polyfunctional compound that reacts with a functional group in the end of molecular chain of the polymer is preferably added as a crosslinking agent when producing. Owing to this, the adhesive characteristic under high temperature is improved, and the improvement of the heat resistance is attained.

Here, other additives can be appropriately mixed in the die-adhering layer of the die-bonding film according to needs. Examples of the other additives include flame retardants, silane coupling agents, and ion trapping agents as well as colorants, extenders, fillers, antiaging agents, antioxidants, surfactants, crosslinking agents, etc. Examples of the flame retardants include antimony trioxide, antimony pentoxide, and brominated epoxy resins. The flame retardants can be used alone or two or more types can be used in combination. Examples of the silane coupling agents include β-(3,4-epoxycyclohexyl)ethyltrimethoxysilane, γ-glycidoxypropyltrimethoxysilane, and γ-glycidoxypropylmethyldiethoxysilane. The silane coupling agents can be used alone or two or more types can be used in combination. Examples of the ion trapping agents include hydrotalcites and bismuth hydroxide. The ion trapping agents can be used alone or two or more types can be used in combination.

The die-adhering layer of the die-bonding film is preferably formed of a resin composition containing an epoxy resin and can have a configuration consisting only of a single layer of the adhesive layer formed of a resin composition containing an epoxy resin, for example. Further, it may have a multi-layered structure of two or more layers by appropriately combining a thermoplastic resin having a different glass transition temperature and a thermosetting resin having a different heat curing temperature in addition to the epoxy resin.

Incidentally, since cutting water is used in the cutting step of the semiconductor wafer and water vapor may be generated from the active energy ray-curable pressure-sensitive adhesive layer during the process of peeling the dicing die-bonding film, there is a case where the die-adhering layer absorbs moisture and the moisture content becomes a normal condition or more. When the die-adhering layer is adhered to a substrate etc. with such high moisture content, there is a case where water vapor is accumulated on an adhering interface in the step of after-curing and floating is thus generated. Therefore, by making the die-bonding film have a constitution of sandwiching a core material having high moisture permeability with die-adhering layers, water vapor diffuses through the film in the stage of after-curing, and such a problem can be avoided. From such a viewpoint, the die-bonding film may have a multi-layered structure in which the die-adhering layer is formed on one face or both faces of the core material.

Examples of the core material include films (e.g., polyimide films, polyester films, polyethylene terephthalate films, polyethylene naphthalate films, polycarbonate films, etc.), resin substrates reinforced with a glass fiber or a plastic non-woven fiber, a silicon substrates, and glass substrates.

The thickness of the die-bonding film is not particularly limited. However, it is about 5 μm to 100 μm, and preferably about 5 μm to 50 μm.

The die-bonding film of the dicing die-bonding film is preferably protected by a separator (not shown in Figures). The separator has a function as a protecting material that protects the die-bonding film until it is practically used. Further, the separator can be used as a supporting base material when transferring the die-bonding film to the active energy ray-curable pressure-sensitive adhesive layer. The separator is peeled when a workpiece is attached onto the die-bonding film of the dicing die-bonding film. As the separator, polyethylene and polypropylene and a plastic film (such as polyethylene terephthalate) or a paper whose surface is coated with a releasing agent such as a fluorine-based releasing agent or a long-chain alkyl acrylate-based releasing agent can be also used. The separator can be formed by a conventionally known method. Moreover, the thickness or the like of the separator is also not particularly limited.

According to the invention, the dicing die-bonding film can be made to have an antistatic function. Owing to the antistatic function, the circuit can be prevented from breaking down due to the generation of electrostatic energy during adhesion and peeling thereof and charging of a workpiece (a semiconductor wafer, etc.) by the electrostatic energy. Imparting of the antistatic function can be performed by an appropriate manner such as a method of adding an antistatic agent or a conductive substance to the base material, the active energy ray-curable pressure-sensitive adhesive layer, or the die-bonding film or a method of providing a conductive layer composed of a charge-transfer complex, a metal film, or the like onto the base material. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, a flake-shaped powder of a metal such as silver, aluminum, gold, copper, nickel, and a conductive alloy; a metal oxide such as alumina; amorphous carbon black, and graphite. However, the die-bonding film is preferably non-conductive from the viewpoint of having no electric leakage.

The dicing die-bonding film of the invention can have an appropriate form such as a sheet form or a tape form.

(Producing Method of Dicing Die-Bonding Film)

The producing method of the dicing die-bonding film of the invention is described with the dicing die-bonding film 10 as an example. First, the base material 1a can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Next, the active energy ray-curable pressure-sensitive adhesive layer 1b is formed by applying an active energy ray-curable pressure-sensitive adhesive composition containing the active energy ray-curable pressure-sensitive adhesive and a gas-generating agent on the base material 1a, followed drying (by crosslinking under heating according to needs). Examples of the application manner include roll coating, screen coating, and gravure coating. Further, the application of the active energy ray-curable pressure-sensitive adhesive composition may be performed directly on the base material 1a to form the active energy ray-curable pressure-sensitive adhesive layer 1b on the base material 1a, or the active energy ray-curable pressure-sensitive adhesive composition may be applied on a releasing paper or the like whose surface has been subjected to a releasing treatment and then transferred onto the base material 1a to form the active energy ray-curable pressure-sensitive adhesive layer 1b on the base material 1a.

On the other hand, an application layer is formed by applying a forming material for forming the die-adhering layer (die-bonding film) 3 onto a releasing paper so as to have a prescribed thickness and further drying under prescribed conditions. The die-adhering layer 3 is formed on the active energy ray-curable pressure-sensitive adhesive layer 1b by transferring this application layer onto the active energy ray-curable pressure-sensitive adhesive layer 1b. The die-adhering layer 3 may also be formed on the active energy ray-curable pressure-sensitive adhesive layer 1b by directly applying the forming material for forming the die-adhering layer 3 on the active energy ray-curable pressure-sensitive adhesive layer 1b, followed by drying under prescribed conditions. The dicing die-bonding film 10 according to the invention can be obtained as described above.

(Semiconductor Wafer)

The semiconductor wafer is not particularly limited as long as it is a known or commonly used semiconductor wafer and can be appropriately selected from semiconductor wafers made of various materials. In the invention, as the semiconductor wafer, a silicon wafer can be suitably used.

(Producing Method of Semiconductor Device)

The process for producing the semiconductor device of the invention is not particularly limited as long as it is a process for producing a semiconductor device using the dicing die-bonding film. The semiconductor device can be produced using the dicing die-bonding film of the invention as follows after the separator optionally provided on the die-bonding film (die-adhering layer) is appropriately peeled. Hereinafter, referring to FIGS. 3A to 3E, the process is described while using the dicing die-bonding 11 as an example. First, a semiconductor wafer 4 is press-bonded onto the die-adhering layer (die-bonding film) 31 in the dicing die-bonding film 11, and it is fixed by adhesion and holding (mounting step). The present step is performed while pressing with a pressing means such as a pressing roll.

Next, the dicing of the semiconductor wafer 4 is performed. Consequently, the semiconductor wafer 4 is cut into a prescribed size and individualized (is formed into small pieces) to produce a semiconductor chips 5. The dicing is performed following a usual method from the circuit face side of the semiconductor wafer 4, for example. Moreover, the present step can adopt, for example, a cutting method called full-cut that forms a slit into the dicing die-bonding film 11. The dicing apparatus used in the present step is not particularly limited, and a conventionally known apparatus can be used. Further, since the semiconductor wafer 4 is adhered and fixed by the dicing die-bonding film 11, chip crack and chip fly can be suppressed, as well as the damage of the semiconductor wafer can also be suppressed. In this connection, in the case where the die-adhering layer is formed of a resin composition containing an epoxy resin, even when it is cut by dicing, the generation of adhesive extrusion at the die-adhering layer is suppressed or prevented in the cut surface. As a result, re-attachment (blocking) of the cut surfaces themselves can be suppressed or prevented and thus the picking-up to be mentioned below can be furthermore conveniently performed.

In the case where the dicing die-bonding film is expanded, the expansion can be performed using a conventionally known expanding apparatus. The expanding apparatus has a doughnut-shaped outer ring capable of pushing the dicing die-bonding film downward through a dicing ring and an inner ring which has a diameter smaller than the outer ring and supports the dicing die-bonding film. Owing to the expanding step, it is possible to prevent the damage of adjacent semiconductor chips through contact with each other in the picking-up step to be mentioned below.

Picking-up of the semiconductor chip 5 is performed in order to collect a semiconductor chip 5 that is adhered and fixed to the dicing die-bonding film 11. In the case where the gas-generating agent in the active energy ray-curable pressure-sensitive adhesive layer 1b is an active energy ray irradiation-type gas-generating agent which generates a gas by an active energy ray, a dicing die-bonding film on which a wafer has been mounted is first irradiated with an active energy ray in order to generate a gas from the gas-generating agent in the active energy ray-curable pressure-sensitive adhesive layer 1b and cure the active energy ray-curable pressure-sensitive adhesive layer 1b by an active energy ray at the same time. As the active energy ray for irradiation, it is suitable to use an active energy ray (particularly, an ultraviolet ray) including a wavelength region where a gas is generated from the gas-generating agent and a wavelength region where a photopolymerization initiator contained in the active energy ray-curable pressure-sensitive adhesive layer 1b is cleaved. In this connection, the irradiation amount, irradiation time, irradiation apparatus, and the like of the active energy ray are not particularly limited and may be regulated according to needs. Moreover, the irradiation apparatus usable for the active energy ray irradiation is not particularly limited and there may be mentioned the above-exemplified irradiation apparatus such as chemical lamp, black light, mercury arc, carbon arc, low-pressure mercury lamp, medium-pressure mercury lamp, high-pressure mercury lamp, ultrahigh-pressure mercury lamp, or metal halide lamp.

As mentioned above, since a gas is generated from the gas-generating agent and the generated gas invades into the interface between the active energy ray-curable pressure-sensitive adhesive layer 1b and the die-adhering layer 31 to press the die-adhering layer 31, at least a part of the interface between the die-adhering layer 31 and the active energy ray-curable pressure-sensitive adhesive layer 1b is peeled off. In addition, the active energy ray-curable pressure-sensitive adhesive layer 1b is cured with an active energy ray and the re-adhesion of the active energy ray-curable pressure-sensitive adhesive layer 1b to the die-adhering layer 31 can be suppressed or prevented. As mentioned above, at the time when the pressure-sensitive adhesive force between the die-adhering layer 31 and the active energy ray-curable pressure-sensitive adhesive layer 1b is sufficiently lowered, the picking-up of the semiconductor chip with the die-adhering layer is performed.

The method for the picking-up is not particularly limited and various hitherto known methods can be adopted. Examples include a method including pushing up each semiconductor chip 5 from the base material 1a side of the dicing die-bonding film 11 with a needle and picking up the pushed semiconductor chip 5 with a picking-up apparatus. Since the dicing die-bonding film 11 of the invention has a good peeling ability between the die-adhering layer 31 and the active energy ray-curable pressure-sensitive adhesive layer 1b, the picking-up can be performed with reducing a yield ratio by lowering a protrusion amount of the needle or decreasing the number of the needles. Moreover, the re-adhesion of the die-adhering layer 31 to the active energy ray-curable pressure-sensitive adhesive layer 1b is also suppressed or prevented.

Here, the picking-up is performed after curing by irradiating the active energy ray-curable pressure-sensitive adhesive layer 1b with an active energy ray and, in the case where the gas-generating agent is an active energy ray irradiation-type gas-generating agent, after a gas is generated by irradiation with the active energy ray and the gas invades into the interface between the active energy ray-curable pressure-sensitive adhesive layer 1b and the die-adhering layer 31 to press the die-adhering layer 31. Consequently, the pressure-sensitive adhesive force (adhesive force) of the active energy ray-curable pressure-sensitive adhesive layer 1b to the die-adhering layer (die-bonding film) 31 decreases, and the peeling of the semiconductor chip 5 becomes easy. As a result, the picking-up becomes possible without damaging the semiconductor chip 5. The conditions such as irradiation intensity and irradiation time at the active energy ray irradiation are not particularly limited, and they may be appropriately set according to needs. Moreover, the irradiation apparatus usable for the active energy ray irradiation is not particularly limited and there may be mentioned the above-exemplified irradiation apparatus such as chemical lamp, black light, mercury arc, carbon arc, low-pressure mercury lamp, medium-pressure mercury lamp, high-pressure mercury lamp, ultrahigh-pressure mercury lamp, or metal halide lamp.

The semiconductor chip 5 picked up is adhered and fixed to an adhered 6 through the die-adhering layer (die-bonding film) 31 interposed therebetween (die bonding). The adhered 6 is mounted onto a heat block 9. Examples of the adhered 6 include a lead frame, a TAB film, a substrate, and a semiconductor chip separately produced. The adhered 6 may be a deformable adhered that is easily deformed, or may be a non-deformable adhered (such as a semiconductor wafer) that is difficult to deform, for example.

A conventionally known substrate can be used as the substrate. Further, a metal lead frame such as a Cu lead frame or a 42 Alloy lead frame and an organic substrate composed of glass epoxy, BT (bismaleimide-triazine), or a polyimide can be used as the lead frame. However, the invention is not limited to the above, and includes a circuit substrate that can be used after mounting a semiconductor element and electrically connecting with the semiconductor element.

In the case where the die-adhering layer (die-bonding film) 31 is formed of resin composition containing a thermosetting resin such as an epoxy resin (in the case of a thermally-curable die-adhering layer), the adhesive force is enhanced by heat-curing and thus the semiconductor chip 5 can adhered and fixed onto the adhered 6 to improve the heat resistance strength. Here, a product in which the semiconductor chip 5 is adhered and fixed onto a substrate or the like through the semiconductor wafer attaching part 31a can be subjected to a reflow step. Thereafter, wire bonding is performed by electrically connecting the tip of a terminal part (inner lead) of the substrate and an electrode pad (not shown in figures) on the semiconductor chip 5 by means of a bonding wire 7, and furthermore, the semiconductor chip 5 is sealed with a sealing resin 8, followed by curing the sealing resin 8. Accordingly, the semiconductor device according to the present embodiment is manufactured.

EXAMPLES

The following will illustratively describe preferred examples of the invention in detail. However, the materials, the mixing amount, and the like described in these examples are not intended to limit the scope of the invention to only those unless otherwise stated, and they are merely explanatory examples. Moreover, part in each example is a weight standard unless otherwise stated.

Example 1

<Manufacture of Dicing Film>

An acrylic polymer X was obtained by charging 90 parts of 2-ethylhexyl acrylate (hereinafter sometimes refers to as "2EHA"), 10 parts of 2-hydroxyethyl acrylate (hereinafter sometimes refers to as "HEA"), 0.2 part of benzoyl peroxide, and 65 parts of toluene into a reactor equipped with a condenser, a nitrogen introducing pipe, a thermometer, and a stirring apparatus, followed by performing a polymerization treatment at 61° C. for 6 hours under a nitrogen atmosphere.

An acrylic polymer Y was obtained by adding 12.7 parts of 2-methacryloyloxyethyl isocyanate (sometimes referred to as "MOI") (95 mol % based on HEA) to 100 parts of the acrylic polymer X, followed by performing an addition reaction treatment at 50° C. for 48 hours in an air stream.

Next, a pressure-sensitive adhesive solution of an active energy ray-curable pressure-sensitive adhesive was prepared by adding 3 parts of a polyisocyanate compound (trade name "COLONATE L" manufactured by Nippon Polyurethane Industry Co., Ltd.) and 80 parts of a gas-generating agent (trade name "VAm-100" manufactured by Wako Pure Chemical Industries, Ltd.) to 100 parts of the acrylic polymer Y.

A pressure-sensitive adhesive layer (active energy ray-curable pressure-sensitive adhesive layer) having a thickness of 10 µm was obtained by applying the pressure-sensitive adhesive solution prepared above onto a releasing liner composed of a polyethylene terephthalate (PET) film on which a releasing treatment (mold release-treatment) had been performed, followed by drying at 80° C. for 2 minutes. Then, a polyolefin film having a thickness of 100 µm was attached onto a surface of the pressure-sensitive adhesive layer on the releasing liner to manufacture an active energy ray-curable pressure-sensitive adhesive sheet (ultraviolet ray-curable adhesive sheet) as a dicing film. Thereafter, the pressure-sensitive adhesive sheet was stored at 50° C. for 48 hours.

<Manufacture of Die-Bonding Film>

59 parts of an epoxy resin 1 (trade name "EPICOAT 1004" manufactured by Japan Epoxy Resins (JER) Co., Ltd.), 53 parts of an epoxy resin 2 (trade name "EPICOAT 827" manufactured by Japan Epoxy Resins (JER) Co., Ltd.), 121 parts of a phenol resin (trade name "MILEX XLC-4L" manufactured by Mitsui Chemicals, Inc.), 222 parts of sphere silica (trade name "SO-25R" manufactured by Admatechs Co., Ltd.) based on 100 parts of an acrylic acid ester-based polymer (trade name "PARACRON W-197CM" manufactured by Negami Chemical Industrial Co., Ltd.) containing ethyl acrylate-methyl methacrylate as the main component were dissolved into methyl ethyl ketone to prepare a solution of an adhesive composition having a solid concentration of 23.6% by weight.

The solution of the adhesive composition was applied onto a releasing liner composed of a PET film on which a mold release-treatment had been performed, and then dried at 130° C. for 2 minutes. Accordingly, a die-bonding film composed of a die-adhering layer having a thickness of 25 µm was manufactured. Furthermore, a dicing die-bonding film (pressure-sensitive adhesive sheet having die-adhering layer attached thereto) according to the present Example 1 was obtained by transferring the die-bonding film onto the active energy ray-curable pressure-sensitive adhesive layer side of the dicing film described above.

Examples 2 to 8

A dicing die-bonding film was manufactured in each of Examples 2 to 8 in the same manner as in Example 1 except that the dicing film was changed to a dicing film having the composition and the content (the composition of the base polymer of the pressure-sensitive adhesive, the content of the crosslinking agent, the content of the gas-generating agent, etc.) shown in Table 1.

Example 9

A dicing die-bonding film was manufactured in Example 9 in the same manner as in Example 1 except that the composition of the base polymer, the crosslinking agent, and the amount of the gas-generating agent were changed to those described in Table 1 and additionally 20 parts of a terpenephenol-based resin (trade name "PR-12603" manufactured by Sumitomo Bakelite Co., Ltd.) was added.

Comparative Examples 1 to 4

A dicing die-bonding film was produced in each of Comparative Examples 1 to 4 in the same manner as in Example 1 except that the dicing film was changed to a dicing film having the composition and the content (the composition of the base polymer of the pressure-sensitive adhesive, the content of the crosslinking agent, the content of the gas-generating agent, etc.) shown in Table 1.

insoluble content was weighed (weight after immersion and drying), and a gel fraction (% by weight) was calculated according to the following equation (1).

Gel reaction (% by weight)={(Weight after immersion and drying)/(Sample weight)}×100  (1)

TABLE 1

| | Monomer composition (part) | | | | Added amount of MOI* | Sumilite (part) | Cross-linking agent (part) | Gas-generating agent (part) | Fraction of insoluble matter (% by weight) | Elastic modulus after UV curing (MPa) | Tg of pressure-sensitive adhesive (°C.) | Surface free energy (mJ/m²) | Evaluation of re-adhesion | Pick-up success ratio (%) |
|---|---|---|---|---|---|---|---|---|---|---|---|---|---|---|
| | 2EHA | BA | HEA | AA | | | | | | | | | | |
| Example 1 | 90 | — | 10 | — | 12.0 (90) | — | 3 | 80 | 97 | 21.0 | −66 | 27.5 | Good | 100 |
| Example 2 | 90 | — | 10 | — | 8.0 (60) | — | 3 | 80 | 92 | 13.3 | −65 | 26.4 | Good | 97 |
| Example 3 | 90 | — | 10 | — | 12.0 (90) | — | 3 | 10 | 94 | 19.8 | −66 | 27.2 | Good | 84 |
| Example 4 | 75 | — | 25 | — | 30.1 (90) | — | 3 | 80 | 95 | 19.0 | −57 | 28.9 | Good | 94 |
| Example 5 | 75 | — | 25 | — | 20.0 (60) | — | 3 | 80 | 91 | 10.4 | −59 | 27.4 | Good | 92 |
| Example 6 | 60 | 30 | 10 | — | 12.0 (90) | — | 3 | 80 | 97 | 32.0 | −61 | 32.1 | Good | 91 |
| Example 7 | 60 | 30 | 10 | — | 20.0 (60) | — | 3 | 80 | 90 | 15.1 | −61 | 30.7 | Good | 87 |
| Example 8 | 90 | — | 10 | — | 12.0 (90) | — | 0.05 | 80 | 81 | 5.3 | −65 | 27.9 | Moderate | 69 |
| Example 9 | 90 | — | 10 | — | 12.0 (90) | 20 | 3 | 80 | 95 | 21.6 | −65 | 36.1 | Moderate | 57 |
| Comparative Example 1 | 90 | — | 10 | — | 12.0 (90) | — | 3 | None | 93 | 13.5 | −66 | 27.6 | No peeling Impossible to evaluate | 0 |
| Comparative Example 2 | 30 | 60 | 10 | — | 12.0 (90) | — | 3 | 80 | 96 | 18.8 | −57 | 34.1 | Poor | 0 |
| Comparative Example 3 | 85 | — | 10 | 5 | 12.0 (90) | — | 3 | 80 | 91 | 10.1 | −61 | 33.6 | No peeling Impossible to evaluate | 0 |
| Comparative Example 4 | 90 | — | 10 | — | — | — | 3 | 80 | 65 | 3.5 | −66 | 22.7 | Poor | 9 |

*Added amount of MOI to HEA (part). The values in parenthesis means corresponding values (mol %). Incidentally, meanings of the abbreviations described in Table 1 are as follows.
2EHA: 2-ethylhexyl acrylate
BA: n-butyl acrylate
AA: acrylic acid
HEA: 2-hydroxyethyl acrylate
MOI: 2-methacryloyloxyethyl isocyanate
Sumilite: a terpenephenol-based resin (trade name "PR-12603" manufactured by Sumitomo Bakelite Co., Ltd.)
Crosslinking agent: isocyanate-based crosslinking agent (trade name "COLONATE L" manufactured by Nippon Polyurethane Industry Co., Ltd.)
Gas-generating agent: trade name "VAm-100" manufactured by Wako Pure Chemical Industries, Ltd.

(Evaluation)

With regard to the dicing die-bonding films according to Examples 1 to 9 and Comparative Examples 1 to 4, a gel fraction of the pressure-sensitive adhesive layer in each dicing film, an elastic modulus regarding to the pressure-sensitive adhesive layer in each dicing film, glass transition temperature regarding to the pressure-sensitive adhesive layer in each die-bonding film, surface free energy of the pressure-sensitive adhesive layer in each dicing film, re-adhesion preventive properties, and pick-up properties were evaluated or measured by the following evaluation or measurement methods. The results of the evaluation and measurement were also described in Table 1.

<Measurement Method of Gel Fraction>

About 0.1 g was sampled from the active energy ray-curable pressure-sensitive adhesive layer subjected to ultraviolet ray irradiation (wavelength: 365 nm) at an ultraviolet ray irradiation integrated light intensity of 1,000 mJ/cm² using an ultraviolet ray (UV) irradiation apparatus of a trade name "UM-810" manufactured by Nitto Seiki Co., Ltd. and was precisely weighed (sample weight). After wrapped with a mesh sheet, it was immersed in about 50 ml of ethyl acetate at room temperature for 1 week. Thereafter, a solvent-insoluble content (a content in the mesh sheet) was taken out of the ethyl acetate and dried at 80° C. for about 2 hours, the solvent-insoluble content was weighed (weight after immersion and drying), and a gel fraction (% by weight) was calculated according to the following equation (1).

<Measurement Method of Elastic Modulus of Pressure-Sensitive Adhesive Layer of Dicing Film>

Ultraviolet ray (UV) irradiation (wavelength: 365 nm) was applied to a dicing film (pressure-sensitive adhesive sheet) before lamination with the die-adhering layer using an ultraviolet ray (UV) irradiation apparatus of a trade name "UM-810" manufactured by Nitto Seiki Co., Ltd, under a condition of an ultraviolet ray irradiation integrated light intensity of 1,000 mJ/m². Only the pressure-sensitive adhesive layer (active energy ray-curable pressure-sensitive adhesive layer) after ultraviolet ray irradiation was separated and a tensile test was performed at a distance between chucks of 10 mm and a test speed (drawing rate) of 50 mm/min using a tensile tester (trade name "Autograph AG-IS" manufactured by Shimadzu Corporation) under the environment of the test place (23±2° C., 50±5% RH) described in JIS Z 8703. Then, an elastic modulus (initial elastic modulus) was determined from the slope of the tangent line of low strain region part of the obtained stress-strain curve.

<Glass Transition Temperature of Pressure-Sensitive Adhesive Layer in Dicing Film>

As the pressure-sensitive adhesive layer (active energy ray-curable pressure-sensitive adhesive layer) of the dicing film (pressure-sensitive adhesive sheet), a similar pressure-sensitive adhesive layer (sample) was prepared in the same manner except that the gas-generating agent was not contained, and measurement was performed at a sample thickness of about 1.5 mm using a jig of a parallel plate of 7.9 mmφ in a shear mode at a frequency of 1 Hz and a temperature-elevating rate of 5° C./minute using a dynamic viscoelasticity measuring apparatus (trade name "ARES" manufactured by Rheometrics Co., Ltd.). In the obtained spectrum of the shear loss modulus G", a temperature at which the elastic modulus rapidly changes from a high elastic modulus to a low elastic modulus was regarded as the glass transition temperature (Tg; ° C.) of the base polymer.

<Evaluation Method of Surface Free Energy>

A contact angle θ (rad) was determined by dropping a liquid droplet of about 1 µL of water (distilled water) or methylene iodide onto a surface of the pressure-sensitive adhesive layer (active energy ray-curable pressure-sensitive adhesive layer before active energy ray curing in the cases of active energy ray-curable pressure-sensitive adhesive layers (Examples 1 to 9 and Comparative Examples 1 to 3)) of the dicing film (pressure-sensitive adhesive sheet) before lamination with the die-adhering layer under the environment of the test place (temperature: 23±2° C., humidity: 50±5% RH) described in JIS Z 8703 and measuring by three point method after 30 seconds from the dropping using a surface contact angle meter "CA-X" (manufactured by FACE Company). The surface free energy ($\gamma_S$) of the pressure-sensitive adhesive layer in the dicing film was calculated by solving two equations as simultaneous linear equations obtained utilizing the obtained two contact angles, values known from literatures as surface free energy values of water and methylene iodide, and the following equations (2a) to (2c).

$$\gamma_S = \gamma_S^d + \gamma_S^p \quad (2a)$$

$$\gamma_L = \gamma_L^d + \gamma_L^p \quad (2b)$$

$$(1+\cos\theta)\gamma_L = 2(\gamma_S^d \gamma_L^d)^{1/2} + 2(\gamma_S^p \gamma_L^p)^{1/2} \quad (2c)$$

wherein respective symbols in the equations (2a) to (2c) are as follows, respectively.

θ: contact angle measured with a liquid drop of water or methylene iodide (rad)

$\gamma_S$: surface free energy of the pressure-sensitive adhesive layer (mJ/m$^2$)

$\gamma_S^d$: dispersing component in surface free energy of the pressure-sensitive adhesive layer (mJ/m$^2$)

$\gamma_S^p$: polar component in surface free energy of the pressure-sensitive adhesive layer (mJ/m$^2$)

$\gamma_L$: surface free energy of water or methylene iodide (mJ/m$^2$)

$\gamma_L^d$: dispersing component in surface free energy of water or methylene iodide (mJ/m$^2$)

$\gamma_L^p$: polar component in surface free energy of water or methylene iodide (mJ/m$^2$)

Value known as surface free energy value of water (distilled water): [dispersing component ($\gamma_L^d$): 21.8 (mJ/m$^2$), polar component ($\gamma_L^p$): 51.0 (mJ/m$^2$)]

Value known as surface free energy value of methylene iodide: [dispersing component ($\gamma_L^d$): 49.5 (mJ/m$^2$), polar component ($\gamma_L^p$): 1.3 (mJ/m$^2$)]

<Evaluation Method of Re-Adhesion Preventive Properties>

A dicing film (pressure-sensitive adhesive sheet) before lamination with the die-adhering layer was cut into a size of 3 cm square, which was then press-bonded onto a slide glass using a 2 kg roller under the environment of a test place (temperature: 23±2° C., humidity: 50±5% RH) described in JIS Z 8703. Then, using an ultraviolet ray (UV) irradiation apparatus of a trade name "UM-810" (manufactured by Nitto Seiki Co., Ltd.), irradiation with an ultraviolet ray (wavelength: 365 nm) under a condition of an ultraviolet irradiation integrated light quantity of 1,000 mJ/cm$^2$ was performed from the base material side of the dicing film. After 1 minute and 5 minutes of the ultraviolet ray irradiation, a case where the dicing film could be peeled from the slide glass was evaluated as "Good", a case where it could be peeled in the test after 1 minute of irradiation but could not peeled in the test after 5 minutes of irradiation was evaluated as "Moderate", and a case where it could not be peeled in the both tests after 1 minute and 5 minutes of irradiation was evaluated as "Poor".

<Evaluation Method of Pick-up Properties>

Using the dicing die-bonding film of each of Examples and Comparative Examples, the peeling ability was evaluated in the following manner after actual dicing of a semiconductor wafer, thereby picking-up performance of each dicing die-bonding film being evaluated.

A semiconductor wafer (diameter of 8 inches, thickness of 0.6 mm; material: a silicon mirror wafer) was subjected to rear surface polishing treatment and a mirror wafer having a thickness of 0.025 mm was used as a workpiece. After the separator was peeled from the dicing die-bonding film, the mirror wafer (workpiece) was attached onto the die-bonding film by a thermal lamination method and further the semiconductor wafer was diced into a chip of 10 mm square by means of a rotary round blade. In this connection, the dicing was performed as full cut so as to be a chip size of 10 mm square. Moreover, conditions for semiconductor wafer grinding, attaching conditions, and dicing conditions are as follows.

(Conditions for Semiconductor Wafer Grinding)

Grinding apparatus: trade name "DFG-8560" manufactured by DISCO Corporatiohn

Semiconductor wafer: 8 inch diameter (rear surface was ground so that the thickness became from 0.6 mm to 0.025 mm)

(Attaching Conditions)

Attaching apparatus: trade name "MA-3000II" manufactured by Nitto Seiki Co., Ltd.

Attaching speed: 10 mm/min

Attaching pressure: 0.15 MPa

Stage temperature when attaching: 40° C.

(Dicing Conditions)

Dicing apparatus: trade name "DFD-6361" manufactured by DISCO Corporation

Dicing ring: "2-8-1" (manufactured by DISCO Corporation)

Dicing speed: 30 mm/sec

Dicing Blade:

Z1; "NBC-ZH226J27HAAA" manufactured by DISCO Corporation Dicing blade rotation speed:

Z1; 30,000 rpm

Cutting method: single step cutting

Wafer chip size: 10.0 mm square

Then, using a trade name "UM-810" (manufactured by Nitto Seiki Co., Ltd.) as an ultraviolet ray (UV) irradiation apparatus, the dicing die-bonding film was irradiated with an ultraviolet ray (wavelength: 365 nm) at an ultraviolet irradiation integrated light quantity of 1,000 mJ/cm$^2$ from the base material side of the dicing film. After 1 minute from the start of irradiation, the dicing die-bonding film was reversed so that the dicing die-bonding film was turned upside down in the air, the diced semiconductor chips were put down, and the chips with the die-bonding film were peeled off by free falling. Thereafter, among 400 pieces of the semiconductor chips, the number of freely fallen pieces was counted and the ratio of the fallen semiconductor ships (peeling ratio; %) was calculated to evaluate the pick-up properties. Therefore, the pick-up properties are better when the peeling ratio is closer to 100%.

As shown in Table 1, it was confirmed that the dicing die-bonding films according to Examples 1 to 9 were excellent in re-adhesion preventive properties and pick-up properties and the adhered such as a semiconductor wafer could be firmly held and dicing could be well performed. Moreover, it was confirmed that the adhered such as a semiconductor chip could be easily and well peeled and picked up by curing and gas generation with an active energy ray induced by irradiation with an active energy ray such as an ultraviolet ray. Furthermore, after the peeling, re-adhesion of the dicing film and die-bonding film was suppressed or prevented, so that picking-up could be effectively performed.

While the present invention has been described in detail and with reference to specific embodiments thereof, it will be apparent to one skilled in the art that various changes and modifications can be made therein without departing from the scope thereof.

This application is based on Japanese patent application No. 2008-301555 filed Nov. 26, 2008 and Japanese patent application No. 2009-174511 filed Jul. 27, 2009, the entire contents thereof being hereby incorporated by reference.

What is claimed is:

1. A dicing die-bonding film comprising:
   a dicing film having a pressure-sensitive adhesive layer provided on a base material; and
   a die-bonding film provided on the pressure-sensitive adhesive layer,
   wherein the pressure-sensitive adhesive layer of the dicing film is an active energy ray-curable pressure-sensitive adhesive layer which contains a gas-generating agent in a ratio of 10 to 200 parts by weight based on 100 parts by weight of a base polymer,
   wherein the base polymer is an acrylic polymer A having a constitution that a polymer composed of a monomer composition containing 50% by weight or more of an acrylic acid ester represented by $CH_2\!\!=\!\!CHCOOR$ (wherein R is an alkyl group having 6 to 10 carbon atoms) and 10% by weight to 30% by weight of a hydroxyl group-containing monomer and containing no carboxyl group-containing monomer is addition reacted with an isocyanate compound having a radical-reactive carbon-carbon double bond in an amount of 50 mol % to 95 mol % based on the hydroxyl group-containing monomer, and
   wherein the die-bonding film is formed of a die-adhering layer.

2. The dicing die-bonding film according to claim 1, wherein the gas-generating agent is a light irradiation-type gas-generating agent which generates a gas by light.

3. The dicing die-bonding film according to claim 1, wherein the active energy ray-curable pressure-sensitive adhesive layer of the dicing film has a gel fraction after curing by active energy ray irradiation of 90% by weight or more.

4. The dicing die-bonding film according to claim 1, wherein the active energy ray-curable pressure-sensitive adhesive layer of the dicing film has an elastic modulus (temperature: 23° C., drawing rate: 50 mm/min, distance between chucks: 10 mm) after curing by active energy ray irradiation of 10 MPa or more.

5. A process for producing a semiconductor device which comprises using the dicing die-bonding film according to claim 1.

* * * * *